US006670098B1

(12) United States Patent
Kunita

(10) Patent No.: US 6,670,098 B1
(45) Date of Patent: Dec. 30, 2003

(54) IMAGE FORMING MATERIAL AND METHOD FOR FORMING THEREOF

(75) Inventor: Kazuto Kunita, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/614,114

(22) Filed: Jul. 11, 2000

(30) Foreign Application Priority Data

Jul. 27, 1999 (JP) .......................................... 11-212453

(51) Int. Cl.$^7$ ................................................ G03F 7/095

(52) U.S. Cl. ................. 430/273.1; 430/156; 430/271.1; 430/944

(58) Field of Search .............................. 430/156, 273.1, 430/944, 271.1

(56) References Cited

U.S. PATENT DOCUMENTS 4,180,604 A * 12/1979 Feng et al. .............. 430/270.1
4,332,873 A * 6/1982 Hughes et al. ........... 430/273.1
4,596,759 A * 6/1986 Schupp et al. ........... 430/273.1
4,863,827 A * 9/1989 Jain et al. .................... 430/145
4,904,564 A * 2/1990 Chiong ....................... 430/156
4,956,261 A * 9/1990 Pawlowski et al. ......... 430/156

FOREIGN PATENT DOCUMENTS

EP 0622683 A1 * 11/1994

* cited by examiner

*Primary Examiner*—Cynthia Hamilton
(74) *Attorney, Agent, or Firm*—Burns, Doane, Swecker & Mathis, LLP

(57) ABSTRACT

A image forming material has a support having thereon a recording layer which is formed of a composition whose solubility in water or in an alkali aqueous solution is altered by the effects of light or heat, and an intermediate layer which is disposed between the support and the recording layer and which has the same function as that of the recording layer and whose sensitivity to light or heat is higher than that of the recording layer.

19 Claims, No Drawings

IMAGE FORMING MATERIAL AND METHOD FOR FORMING THEREOF

BACKGROUND OF THE INVENTION

1. Field of the Invention

The present invention relates to a photosensitive or heat-sensitive image forming material.which can be used as a planographic printing plate material, a color proof, a photoresist, or a color filter. More specifically, the present invention relates to a negative-type or positive-type photosensitive or heat-sensitive image forming material, usable as a plate material for planographic printing, which enables so-called direct plate making in which a plate can be formed directly by scanning an infrared laser based on digital signals from a computer or the like.

2. Description of the Related Art

The development of lasers in recent years has been remarkable. In particular, high-output, compact solid-state lasers and semiconductor lasers (hereinafter occasionally referred to as “infrared lasers”) emitting infrared rays with wavelengths ranging from 760 nm to 1200 nm have become readily available. These infrared lasers are very useful as a recording light source when a printing plate is formed directly based on digital data from a computer or the like. Accordingly, there has been a growing demand in recent years for a photosensitive resin composition which has high sensitivity to such infrared recording light sources. Namely, a photosensitive resin composition in which a photochemical reaction or the like occurs when the photosensitive resin is irradiated with an infrared ray so that the solubility in a developing solution greatly changes has been desired.

Extensive studies have been made of recording materials sensitive to these kinds of laser light. Typical examples of materials which are recordable by an infrared laser having a wavelength of 760 nm or greater include the positive-type recording material described in U.S. Pat. No. 4,708,925 and the negative-type recording material which is crosslinked by an acid catalyst and described in Japanese Patent Application Laid-Open (JP-A) No. 8-276558.

Examples of recording materials sensitive to ultraviolet light or visible laser light having wavelengths ranging from 300 nm to 700 nm include many materials such as negative-type recording materials which are of a radical polymerization type and described in, for example, U.S. Pat. No. 2,850,445 and Japanese Patent Application Publication (JP-B) No. 44-20189. Although higher levels of sensitivity of such recording materials which utilize radical polymerization can be achieved, there has been the problem that the level of sensitivity is greatly reduced due to the polymerization being inhibited by oxygen.

All of these image forming materials are structured of a single-layered recording layer having a single composition, which recording layer is formed on a support such as aluminum or the like. In a single-layered recording layer having a uniform composition, because of the influence of a photosensitive substance or the like, the effect of the energy ray from a light source tends to decrease as the depth from the photosensitive layer surface toward the support becomes larger, so that the effect becomes a minimum in the vicinity of the boundary surface with the support. This tendency becomes even more pronounced if infrared rays are used for exposure because of the problem of heat diffusion to the reverse surface of the support.

In order to ease this tendency, a measure to increase the sensitivity of the recording layer itself can be taken.

However, since an extreme increase in the sensitivity leads to a decline in storage stability in a highly humid environment and presents problems in actual use, there has been a demand for an image forming material which results in high image quality and has excellent storage stability.

A material recordable by an electron beam or short-wave light having wavelengths of 300 nm or less, is important as a photoresist material in particular. In recent years the degree of integration in integrated circuits has increasingly risen, and even in the manufacture of semiconductor substrates such as ultra LSIs and the like, it has become necessary to form ultra-fine patterns having line widths of a half micron or less. In order to satisfy this need, wavelengths used in exposure apparatuses used for photolithography have become increasingly shorter. Far ultraviolet light and excimer light (XeCl, KrF, ArF, and the like) have come to be studied. Further, ultra-fine patterning by an electron beam has come to be studied. In particular, electron beams are believed to be promising as light sources in next-generation patterning technology.

An object common to all of these image forming materials has been how to clarify image ON-OFF, namely how to clarify the portions irradiated and unirradiated (i.e., image portions and non-image portions) with the above-mentioned energies. In relation to this point, with regard to the aforementioned recording layer having a single composition, for example, problems arise due to insufficient adhesion between the support and the image portions in the case of a negative-type image recording material, and film remaining on the support due to insufficient developability in image portions in the case of a positive-type image recording material. Since these problems have not been satisfactorily solved, a new technology different from conventional technologies has been sought.

SUMMARY OF THE INVENTION

An object of the present invention is to provide a photosensitive or heat-sensitive image forming material which can be formed directly from digital data from a computer or the like by using a solid-state laser or semiconductor laser emitting infrared rays, and which has excellent image adhesion in the case of a negative-type and leaves no film in non-image portions on the support in the case of a positive-type and which can produce high-quality images and has excellent storage stability.

As a result of their extensive studies of the layer structure of recording layers in image forming materials, the present inventors discovered that when a recording layer having ordinary sensitivity is provided in the vicinity of the surface to be exposed, by disposing a recording layer having an even higher level of sensitivity to an exposing light source between the former recording layer and a support, a high-quality image recorded by an infrared laser can be formed, and the problem of storage stability can be solved. The inventors therefore devised the present invention.

That is, the first aspect of the present invention is an image forming material, comprising(a) a support, (b) a recording layer disposed on the support, the recording layer including at least one composition having a solubility in water or an alkali aqueous solution that is changed when subjected to light or heat, and (c) an intermediate layer disposed between the support and the recording layer, having the same function as that of the recording layer but whose sensitivity to light or heat is higher than that of the recording layer. Further, the second aspect of the present invention is a method of making an image forming material, comprising the steps of (a) providing a support, (b) disposing an intermediate layer on the support, which includes a first substance having a solubility in water or an alkali aqueous solution that changes when subjected to light or heat, and (c) disposing a recording layer on the intermediate layer, which includes a second substance having a solubility in water or an alkali aqueous solution that changes when subjected to light or heat, and having a smaller sensitivity than that of the first substance.

The action of the image forming material of the present invention is not altogether clear. However, in the image forming material of the present invention, by disposing a layer, having the same function as that of the recording layer but an even higher level of sensitivity, as an intermediate layer between the support and the recording layer, changes in physical properties in the vicinity of the boundary surface with the support can be amplified. Thus, so-called high image quality (a high level of adhesion in the case of a negative type, and a high ability to eliminate film retention in the case of a positive type) can be attained.

Further, when a recording layer having a high level of sensitivity is provided, a problem ordinarily arises in that the storage stability in high humidity declines. However, this decline in storage stability actually is caused by humidity from the surface of the recording layer, i.e., from the influence of moisture penetrating the recording layer. Therefore, by disposing, as a recording layer in direct contact with the environment, a recording layer having good stability and an ordinary level of sensitivity, the layer having a high level of sensitivity is consequently protected and excellent storage stability can be sustained, even in high humidity.

Accordingly, both high image quality and storage stability in high humidity can be achieved with the present layer structure.

Moreover, in the present invention, the photosensitive or heat-sensitive image forming material (hereinafter simply referred to as image forming material)covers an image forming materials sensitive to both light and heat.

DESCRIPTION OF THE PREFERRED EMBODIMENTS

The present invention is described in detail below.

In the image forming material of the present invention, two layers of recording layer, which have different sensitivities to light or heat and are used in recording, are laminated on a support. The structures of the recording layers are not particularly limited. Preferred examples of a negative-type recording layer that can be suitably used in the image forming material of the present invention include recording layers of a known radical polymerization type and an acid catalyst cross-linking type. In these recording layers, the radical or acid generated by light irradiation or heating functions as an initiator or catalyst, and the compound structuring the recording layer induces a polymerization or cross-linking reaction, hardens, and forms the image portions. Preferred examples of a positive-type recording layer that can be suitably used in the image forming material of the present invention include a known acid catalyst decomposition type and an interaction-terminating type (heat-sensitive positive types). These recording layers become soluble in water or alkaline water due to the bonds of the polymer compound, which had formed the layer, being terminated and the like by thermal energy or an acid generated by light irradiation or heating. Thus undesired portions of the layers are removed by development and non-image portions are formed.

The present invention relates to a principle utilizing the difference in sensitivity (reactivity) between the recording layers and is not influenced by the species of the photosensitive or heat-sensitive materials forming the recording layers.

Each structure of the image forming materials of the present invention is specifically explained below.

The image forming material of the present invention is provided with a support having thereon a recording layer composed of a composition whose solubility to water or an alkali aqueous solution is changed by the effect of light or heat. Usually, the recording layer comprises a polymer insoluble in water but soluble in an alkali aqueous solution, wherein the bonds of the polymer constituting the layer are severed by the effect of light or heat, or alternatively, the bonds are strengthened or newly formed so that the polymer is hardened, and accordingly the solubility of the layer to an alkaline developing solution increases or decreases.

In the present invention, a polymer insoluble in water but soluble in an alkali aqueous solution is simply referred to as "a polymer soluble in an alkali aqueous solution" upon occasion.

In a case in which negative-type recording is carried out with the image forming material of the present invention or by an image forming method which employs this same material, a recording layer thereof has a structural characteristic whose solubility in an alkaline developing solution is decreased by the effect of light or heat. Therefore, it is preferable that the recording layer includes, in addition to the alkaline water-soluble polymer, a compound which is cross-linked by an acid and a compound which releases acid due to heat. On the other hand, in the case where positive-type recording is carried out, the recording layer takes on a structure whose solubility in an alkaline developing solution is increased by the effect of light or heat. Therefore an onium salt-type infrared absorbent is suitably used as an infrared absorbent to accelerate the solubilization of the polymer soluble in an alkali aqueous solution.

Examples of the binder polymer which can be used in the present invention include known high molecular compounds suitable to a negative type or positive type respectively. The following polymeric compounds can be used in accordance with a negative type or a positive type.

Preferred examples of polymers usable in the recording layer of the negative-type image forming material include a polymer having on the side chain or main chain thereof an aromatic hydrocarbon ring to which a hydroxyl group or an alkoxy group is directly bonded. The alkoxy group is preferably an alkoxy group having 20 or less carbon atoms from the standpoint of sensitivity. Because of the availability of raw materials, a benzene ring, a naphthalene ring, or an anthracene ring is preferable as the aromatic hydrocarbon ring. These aromatic hydrocarbon rings may have at least one of substituent such as a halogen group, a cyano group, and the like other than a hydroxyl group or an alkoxy group. However, from the standpoint of sensitivity, it is preferable that these aromatic hydrocarbon rings do not have any substituents other than a hydroxyl group or an alkoxy group.

The binder polymers suitably usable in the present invention are polymers having the structural unit represented by the following general formula (I) or phenolic resins such as a novolak resin and the like.

General formula (I)

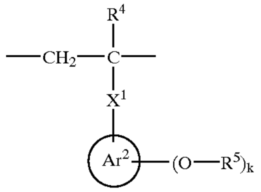

In the general formula (I), $Ar^2$ represents a benzene ring, a naphthalene ring, or an anthracene ring. $R^4$ represents a hydrogen atom or a methyl group. $R^5$represents a hydrogen atom or an alkoxy group having 20 or less carbon atoms. $X^1$ represents either a single bond or a bivalent linking group which contains at least one atom selected from C, H, N, O, and S, and has 0 to 20 carbon atoms. k is an integer of 1 to 4.

Examples of the structural units represented by the general formula (I) suitably usable in the present invention include, but are not limited to, the following structural units ([BP-1] to [BP-6]).

[BP-1]

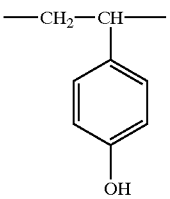

[BP-2]

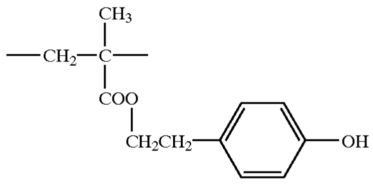

[BP-3]

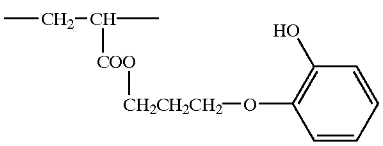

[BP-4]

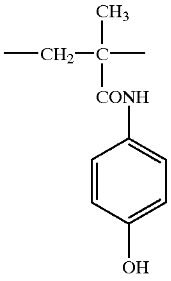

[BP-5]

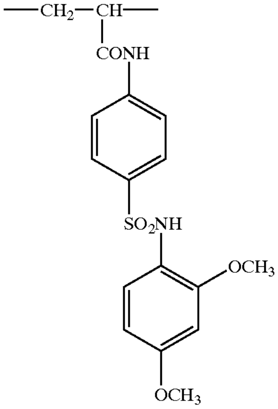

[BP-6]

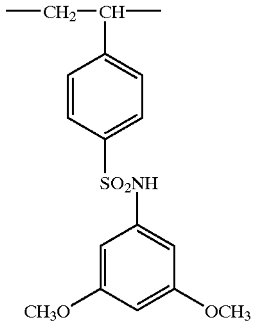

The polymers having these structural units can be obtained by a radical polymerization according to a conventionally known method using corresponding monomers.

In the present invention, the binder polymer to be used may be a homopolymer formed solely of the structural unit represented by the general formula (I). Alternatively, the binder polymer may be a copolymer which comprise this specific structural unit represented by the general formula (I) and at least one of a structural unit derived from other conventionally known monomers. Examples of the other conventionally known monomers include acrylic esters, such as methyl acrylate, ethyl acrylate, propyl acrylate, butyl acrylate, 2-ethylhexyl acrylate, cyclohexyl acrylate, 2-hydroxyethyl acrylate, and benzyl acrylate; methacrylates, such as methyl methacrylate, ethyl methacrylate, propyl methacrylate, butylmethacrylate, 2-ethylhexylmethacrylate, cyclohexyl methacrylate, 2-hydroxyethyl methacrylate, and benzyl methacrylate; styrene; acrylonitrile; monomers having an acidic group, such as acrylic acid and methacrylic acid; and monomers which contain a salt of a strong acid and are exemplified by sodium p-styrenesulfonate, an alkali metal salt of 2-acrylamide-2-methylpropanesufonic acid, tetraalkylammonium salt and potassium 3-sulfopropylacrylate.

The proportion of the structural unit represented by the general formula (III) contained in a copolymer using these monomers is preferably 50–100% by weight and more preferably 60–100% by weight.

The weight-average molecular weight of a polymer used in the present invention is preferably 5,000 or more, more preferably in a range of 10,000 to 300,000, and the number-average molecular weight thereof is preferably 1,000 or more, more preferably in a range of 2,000 to 250,000. The polydispersion degree (weight-average molecular weight/number-average molecular weight) is preferably 1 or more and more preferably in a range of 1.1 to 10.

These polymers, which may be random polymers, block polymers, graft polymers, etc., are preferably random polymers.

Examples of the solvent that is used in the preparation of a polymer for use in the present invention include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, water or the like. These solvents may be used singly or in combinations of two or more species.

Examples of the radical polymerization initiator which can be used when synthesizing a polymer for use in the present invention include known compounds such as an azo-type initiator, a peroxide initiator, and the like.

Next, novolak resins are described. Examples of the novolak resins that are suitably used in the present invention include phenol novolaks, o-, m-, and p-cresol novolaks and copolymers of such compounds, and novolaks utilizing a phenol substituted by a halogen atom, an alkyl group, or the like.

The weight-average molecular weight of the novolak resin is preferably 1,000 or more, more preferably in a range of 2,000 to 20,000, and the number-average molecular weight thereof is preferably 1,000 or more, more preferably in a range of 2,000 to 15,000. The polydispersion degree is preferably 1 or more and more preferably in a range of 1.1 to 10.

In addition, the novolak resins that can be suitably used as adjunct polymers include phenol novolaks, o-, m-, and p-cresol novolaks copolymers of such compounds, and novolaks utilizing a phenol substituted by a halogen atom, an alkyl group, or the like.

The weight-average molecular weight of the novolak resin is preferably 1,000 or more, more preferably in a range of 2,000 to 200,000, and the number-average molecular weight thereof is preferably 1,000 or more, more preferably in a range of 2,000 to 150,000. The polydispersion degree is preferably 1 or more and more preferably in a range of 1.1 to 10.

Polymeric compounds that can be used in positive-type image forming materials include a homopolymer having an acidic group on the main chain and/or side chain thereof, a copolymer of this homopolymers or a copolymer of the homopolymer and other polymer, or a mixture thereof.

Among these, a polymeric compound having on the main chain and/or side chain thereof any one of the following acidic groups (1) to (6) is preferable in terms of solubility in an alkaline developing solution or manifesting an ability to inhibit dissolution.

(1) phenol group (—Ar—OH)

(2) sulfonamide group ($—SO_2NH—R$)

(3) acid group based on a substituted sulfonamide (hereinafter referred to as "active imido group") ($—SO_2NHCOR$, $—SO_2NHSO_2R$, $—CONHSO_2R$)

(4) carboxylic acid group ($—CO_2H$)

(5) sulfonic acid group ($—SO_3H$)

(6) phosphoric acid group ($—PO_3H_2$)

In (1) to (6), Ar represents a divalent aryl linking group which may have a substituent, and R represents a hydrocarbon group which may have a substituent.

Among these alkali aqueous solution soluble polymers having an acidic group selected from (1) to (6), polymers, which are soluble in an alkali aqueous solution and have (1) a phenol group, (2) a sulfonamide group, or (3) an active imido group, are preferable. In particular, alkali aqueous solution soluble polymers, which have (1) a phenol group or (2) a sulfonamide group, are most preferable from the standpoint of sufficiently securing solubility in an alkaline developing solution, development latitude, and film strength.

Examples of the alkali aqueous solution soluble polymers having an acidic group selected from (1) to (6) include the following.

(1) Examples of the alkali aqueous solution soluble polymers having phenol group, include novolak resins, such as a phenol/formaldehyde condensation polymerization product, a m-cresol/formaldehyde condensation polymerization product, a p-cresol/formaldehyde condensation polymerization product, a m-/p-mixed cresol/formaldehyde condensation polymerization product, a phenol/cresol (any of m-cresol, p-cresol, and m-/p-mixed cresol)/formaldehyde condensation polymerization product, and a pyrogallol/acetone condensation polymerization product. A further example is a copolymer obtained by copolymerizing compounds having a phenol group on the side chain thereof. Alternatively, a copolymer obtained by the copolymerization of compound having a phenol group on the side chains thereof and other compound can also be used.

Examples of the compound having a phenol group include an acrylamide, a methacrylamide, an acrylic ester, and a methacrylate, all of which have a phenol group, and hydroxystyrene.

From the standpoint of image formability, the weight-average molecular weight of the polymer soluble in an alkali aqueous solution is preferably $5.0\times10^2$ to $2.0\times10^4$and the number-average molecular weight of the polymer is preferably $2.0\times10^2$ to $1.0\times10^4$. These polymers may be used singly or in combinations of two or more species. Where a combination is employed, the combination may include a phenol/formaldehyde condensation polymerization product, wherein the phenol has an alkyl group having 3 to 8 carbon atoms as a substituent, such as a t-butylphenol/formaldehyde condensation polymerization product or an octylphenol/formaldehyde condensation polymerization product described in U.S. Pat. No. 4,123,279.

(2) Examples of alkali aqueous solution soluble polymers having a sulfonamide group include polymers which have as a main structural component the smallest structural unit derived from a compound having a sulfonamide group. Examples of such compounds include a compound having in the molecule thereof one or more sulfonamide groups in which at least one hydrogen atom is bonded to a nitrogen atom, and one or more polymerizable unsaturated groups. Among these compounds, low-molecular-weight compounds having in the molecules thereof an acryloyl group, an allyl group, or an vinyloxy group, and a substituted or mono-substituted aminosulfonyl group or a substituted sulfonylimino group, are preferable. Examples of these compounds include the compounds represented by the following general formulae II to VI.

II

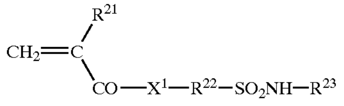

-continued

III

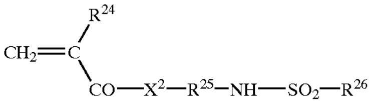

IV

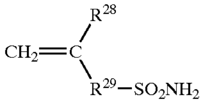

V

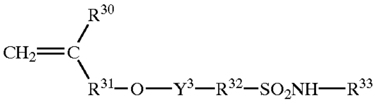

VI

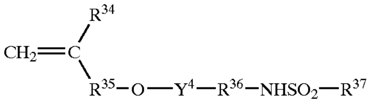

wherein $X^1$ and $X^2$ each represents independently —O— or —$NR^{27}$; $R^{21}$ and $R^{24}$ each represents independently a hydrogen atom or —$CH_3$; $R^{22}$, $R^{25}$, $R^{29}$, $R^{32}$, and $R^{36}$ each represents independently an alkylene group, a cycloalkylene group, an arylene group, or an aralkylene group, which groups have 1 to 12 carbon atoms and may have at least one of substituent respectively; $R^{23}$, $R^{27}$, and $R^{33}$ each represents independently a hydrogen atom, an alkyl group, a cycloalkyl group, an aryl group, or an aralkyl group, which groups have 1 to 12 carbon atoms and may have at least one of substituent respectively; $R^{26}$ and $R^{37}$ each represents independently an alkyl group, a cycloalkyl group, an aryl group, or an aralkyl group, which groups have 1 to 12 carbon atoms and may have at least one of substituent respectively; $R^{28}$, $R^{30}$, and $R^{34}$ each represents independently a hydrogen atom or —$CH_3$; $R^{31}$ and $R^{35}$ each represents independently a single bond, or alternatively, an alkylene group, a cycloalkylene group, an arylene group, or an aralkylene group, which groups have 1 to 12 carbon atoms and may have at least one of substituent respectively; and $Y^3$ and $Y^4$ each represents independently a single bond or —CO—.

Among the compounds represented by the general formulae 1 to 5, specifically m-aminosulfonylphenyl methacrylate, N-(p-aminosulfonylphenyl)methacrylamide, N-(p-aminosulfonylphenyl)acrylamide, or the like can be suitably used in the positive-type planographic printing plate material of the present invention.

(3) Examples of alkali aqueous solution soluble polymer's having an active imido group include polymers which have as a main structural component the smallest structural unit derived from a compound having an active imido group. Examples of such compounds include a compound having in the molecule thereof one or more active imido groups represented by the following structural formula and one or more polymerizable unsaturated groups.

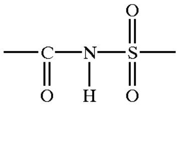

Specifically, N-(p-toluenesulfonyl)methacrylamide, N-(p-toluenesulfonyl)acrylamide, or the like can be suitably used.

(4) Examples of alkali aqueous solution soluble polymers having a carboxylic acid group include polymers which have as a main structural component the smallest structural unit derived from a compound having one or more carboxylic acid groups and one or more polymerizable unsaturated groups.

(5) Examples of alkali aqueous solution soluble polymers having a sulfonic acid group include polymers which have as a main structural component the smallest structural unit derived from a compound having one or more sulfonic acid groups and one or more polymerizable unsaturated groups.

(6) Examples of alkali aqueous solution soluble polymers having a phosphoric acid group include polymers which have as a main structural component the smallest structural unit derived from a compound having one or more phosphoric acid groups and one or more polymerizable unsaturated groups.

The smallest structural unit, having an acidic group selected from the above-mentioned groups (1) to (6) and constituting the alkali aqueous solution soluble polymer and used in a positive-type image forming material, does not need to be of a single species. A polymer copolymerizing two or more species of the smallest structural units each having the same acidic group, or a polymer copolymerizing two or more species of the smallest structural units each having a different acidic group can also be used.

Conventionally known methods such as graft copolymerization, block copolymerization, random copolymerization, and the like can be used as methods of copolymerization.

The aforementioned copolymers are preferably copolymers in which compounds having an acid group selected from the copolymer groups (1) to (6) are included at 10 mol % or more, and more preferably at 20 mol % or more. When the compounds are less than 10 mol %, the development latitude cannot be sufficiently improved.

When the image forming material of the present invention is written with an infrared laser, it is preferable that the recording layer contains an infrared absorbent to permit forming an image from the standpoint of sensitivity.

The infrared absorbent has a function to convert absorbed infrared light into heat. At this time, in the negative-type recording material, an acid-generating agent (described later) is dispersed by the resultant heat, thereby releasing acids and causing a cross-linking reaction within the recording layer. In the positive-type recording material, photochemical reactions and the like occur due to laser scanning, thereby greatly increasing the solubility in the developing solution.

The infrared absorbent used in the present invention is a dye or pigment capable of effectively absorbing an infrared ray having wavelength ranging from 760 nm to 1200 nm. It is preferable that the dye or pigment has an absorption peak(maximum) for a wavelength between 760 nm and 1200 nm.

The infrared absorbents, which can be suitably used when the image forming material of the present invention has a negative-type recording layer, is described in detail below.

Commercially available dyes and known dyes described in, for example, "Senryo Binran(Dye Handbook)" edited by The Society of Synthetic Organic Chemistry, Japan, 1970, may be used for the dye. Specifically, examples of such dyes include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium dyes, and metal thiolate complexes.

Examples of preferable dyes include the cyanine dyes described in JP-A Nos. 58-125246, 59-84356, 59-202829, and 60-78787; methine dyes described in JP-A Nos. 58-173696, 58-181690, and 58-194595; naphthoquinone dyes described in, for example, JP-A Nos. 58-112793, 58-224793, 59-48187, 59-73996, 60-52940, and 60-63744; squarylium dyes described in JP-A No. 58-112792; and the cyanine dyes described in U.K. Patent No. 434,875.

Near-infrared-absorbing sensitizers described in U.S. Pat. No. 5,156,938 are also suitably used. In addition, the following compounds are also preferably used: substituted arylbenzo(thio)pyrylium salts disclosed in U.S. Pat. No. 3,881,924; trimethinethiapyrylium salts described in JP-A No. 57-142645 (U.S. Pat. No. 4,327,169); pyrylium based compounds described in JP-A Nos. 58-181051, 58-220143, 59-41363, 59-84248, 59-84249, 59-146063, and 59-146061; cyanine dyes described in JP-A No. 59-216146; pentamethinethiopyrylium salts described in U.S. Pat. No. 4,283, 475; and pyrylium compounds disclosed in JP-B Nos. 5-13514 and 5-19702.

Other dyes that are described in U.S. Pat. No. 4,756,993 as near-infrared-absorbing dyes represented by the formulas (I) or (II) may also be suitably used.

Among these dyes, cyanine dyes, squarylium dyes, pyrylium dyes, and nickel thiolate complexes are particularly preferable.

Pigments that may be used in the present invention include commercially available pigments and pigments described in "Color Index (CI) Handbook", "Saishin Ganryo Binran" (Current Pigment Handbook) (edited by Nihon Ganryo Gijutsu Kyokai, 1977), "Saishin Ganryo Ouyo Gijutsu" (Current Pigment Application Technology) (published by CMC Shuppan, 1986), and "Insatsu Ink Gijutsu" (Printing Ink Technology) (published by CMC Shuppan, 1984).

Examples of the kinds of pigments that may be used include black pigments, yellow pigments, orange pigments, brown pigments, red pigments, purple pigments, blue pigments, green pigments, fluorescent pigments, metal powder pigments, and otherpigments such as polymer-linked dyes. Specifically, there may be used insoluble azo pigments, azo lake pigments, condensed azo pigments, chelate azo pigments, phthalocyanine based pigments, anthraquinone based pigments, perylene and perynone based pigments, thioindigo based pigments, quinacridone based pigments, dioxazine based pigments, isoindolinone based pigments, quinophthalone based pigments, colored lake pigments, azine pigments, nitroso pigments, nitro pigments, natural pigments, fluorescent pigments, inorganic pigments, and carbon black. Among these pigments, carbon black is preferred.

These pigments may be used without surface treatment, or may be used after being surface-treated. Examples of surface treatment methods include surface coating with a resin or a wax, adhering a surfactant, and binding a reactive substance (such as a silane coupling agent, an epoxy compound, a polyisocyanate, or the like) to pigment surfaces. These surface treatment methods are described in "Kinzoku-sekken no Seishitsu to Ouyo" (Properties of Metallic Soaps and their Applications)" (Sachi Shobo), "Insatsu Ink Gijutsu" (Printing Ink Technology)" (published by CMC Shuppan, 1984), and "Saishin Ganryo Ouyo Gijutsu" (Current Pigment Application Technology) (published by CMC Shuppan, 1986).

The particle size of the pigments preferably falls within the range of0.01–10 μm, more preferably 0.05–1 μm, and most preferably 0.1–1 μm. Particle sizes of less than 0.01 μm are not desirable from the stand point of the stability of the dispersed elements in the coating liquid for the image recording layer, whereas particle sizes greater than 10 μm are not desirable from the stand point of the uniformity of the image recording layer.

Known techniques of dispersion used in the production of ink, toner, and the like can be used as methods for dispersing the pigments. Examples of dispersers include an ultrasonic disperser, a sand mill, an attritor, a pearl mill, a super mill, a ball mill, an impeller, a disperser, a KD mill, a colloid mill, a dynatron, a three-roll mill, and a pressurized kneader. Details thereof are described in aishin Ganryo Ouyo Gijutsu (Current Pigment Application Technology) (published by CMC Shuppan, 1986).

The amounts added of these dyes or pigments are preferably 0.01–30% by weight based on the weight of the total solid content of the coating liquid for the image forming material.

The infrared absorbents, which can be used when the image forming material of the present invention has a positive-type recording layer, is described below.

When an infrared absorbent is used in the positive-type recording layer, a positive action (in which development is inhibited for unexposed portions, and released and accelerated for exposed portions) needs to be generated by interacting with a binder polymer having a specific function group. For this reason, an infrared absorbent having an onium salt type structure is particularly preferable. Specifically, among the aforementioned infrared absorbents usable in the negative-type image recording layer, cyanine dyes and pyrylium salts are particularly preferable. Details of the cyanine dyes and pyrylium salts are as described previously.

Furthermore, the anionic infrared absorbents described in Japanese Patent Application No. 10-237634 can also be suitably used. The anionic infrared absorbent refers to an infrared absorbent which has not a cationic structure but an anionic structure in the mother nucleus of the dye to substantially absorb infrared rays. Examples of the anionic infrared absorbent include (a-1) an anionic metal complex, (a-2) an anionic carbon black, and (a-3) an anionic phthalocyanine.

The anionic metal complex (a-1) refers to a complex in which the overall central metals and ligands, which substantially absorbs light, in the portion of the complex form the anion.

Examples of the anionic carbon black (a-2) include a carbon black to which an anionic group, such as a sulfonic acid group, a carboxylic acid group, a phosphonic acid group, or the like is linked as a substituent. Oxidation of the carbon black with a given acid as well as other means described in the Carbon Black Manual, 3rd edition (edited by the Carbon Black Institute, Apr. 5, 1995, published by the Carbon Black Institute), p.12, may be adopted for introducing these groups into the carbon black.

The anionic phthalocyanine (a-3) refers to a compound in which an anionic group previously mentioned in the description of (a-2) is linked as a substituent to the phthalocyanine skeleton and which, as a whole, forms an anion.

An additional example is the anionic infrared absorbent represented by $[G_a^{-}\text{-M-Gb}]_m$ $X^{m+}$ [$G_a^{-}$ represents an anionic substituent; $G_b$ represents a neutral substituent; $X^{m+}$ represents a cation having a valency of 1~m including a proton wherein m represents an integer of 1 to 6] described in paragraphs [0014] to [0105] of Japanese Patent Application No. 10-237634.

Preferred examples of the infrared absorbent that can be used in the present invention include infrared absorbents having an onium salt structure as shown below. Specific examples (A-1 to A-56) of such infrared absorbents are given below. However, the present invention is not limited to these examples.

A-1
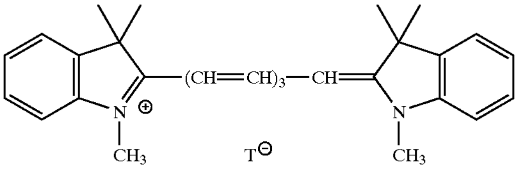
A-2
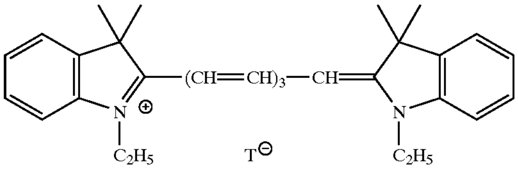
A-3
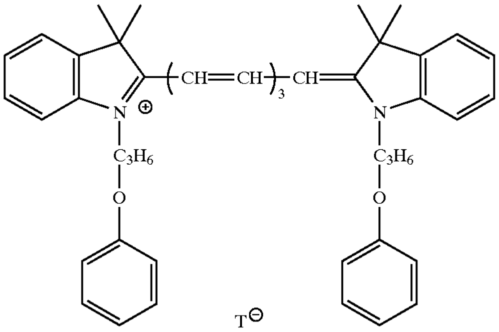
A-4
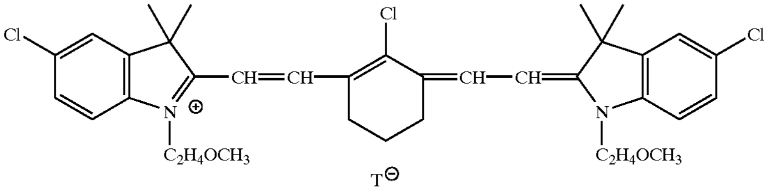
A-5
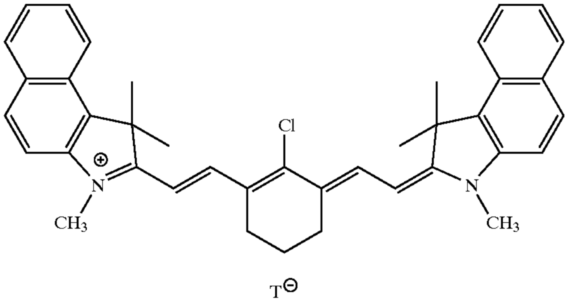
A-6
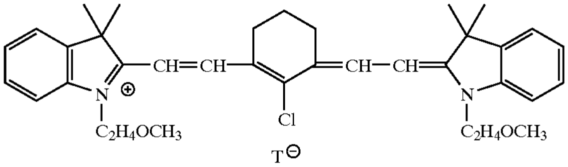
A-7
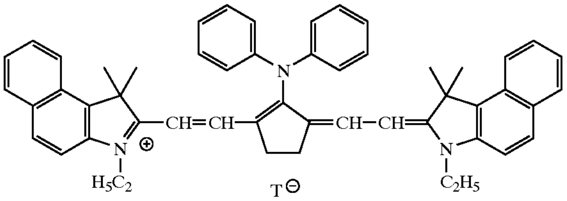
A-8
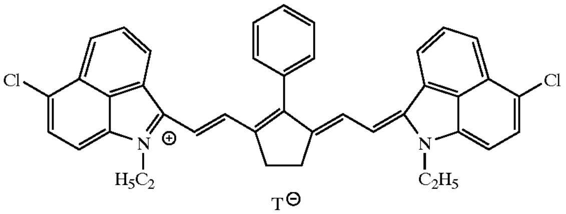
A-9
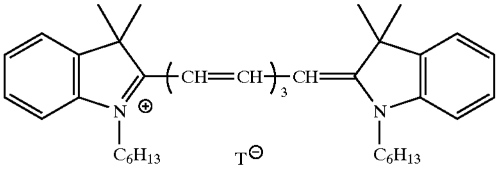
A-10
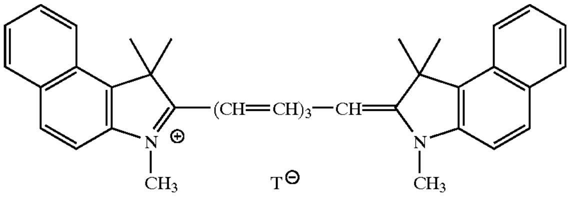

-continued
A-11
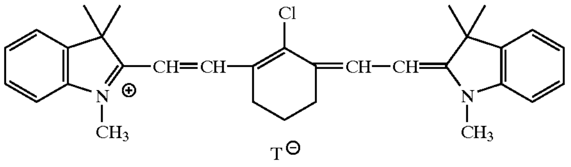
A-12
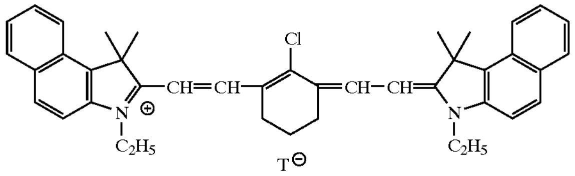
A-13
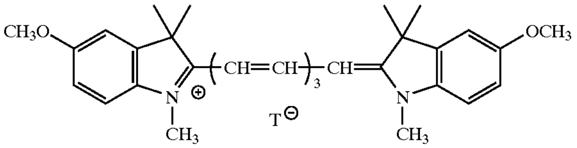
A-14
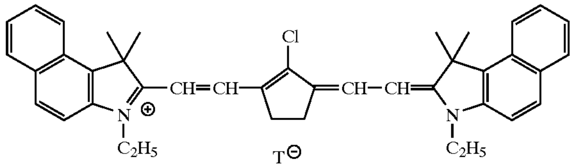
A-15
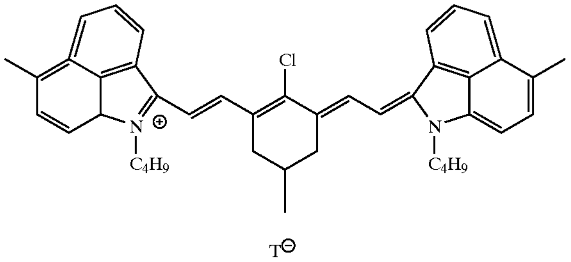
A-16
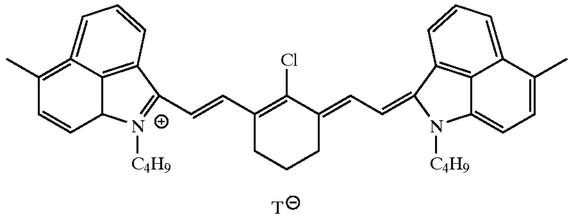
A-17
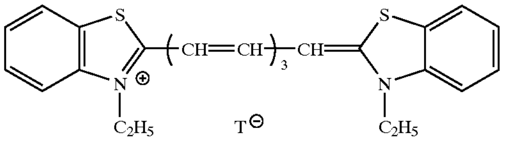
A-18
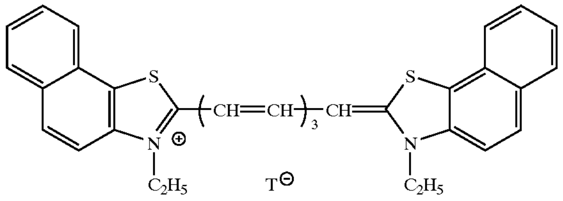
A-19
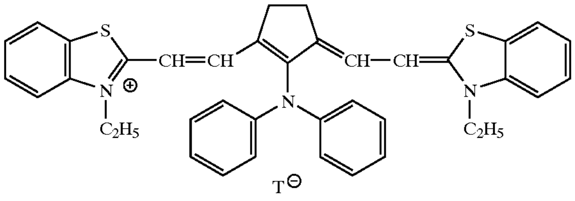
A-20
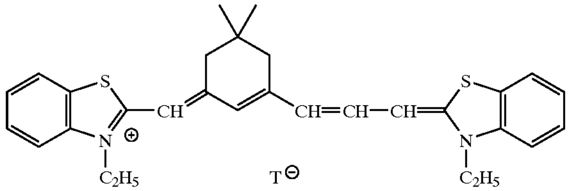
A-21
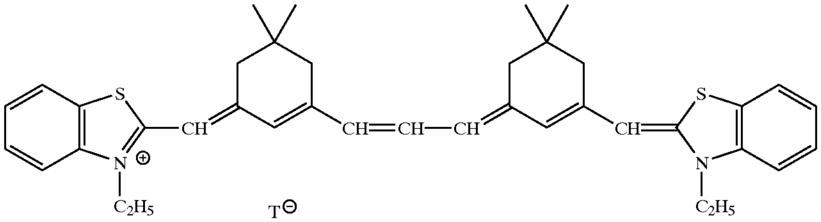

-continued
A-22
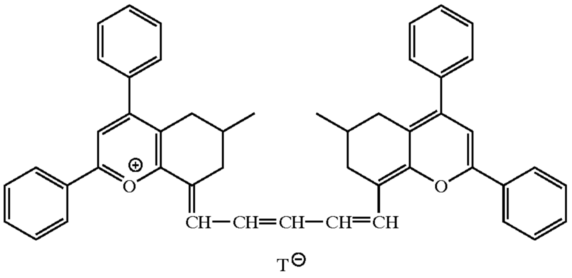
A-23
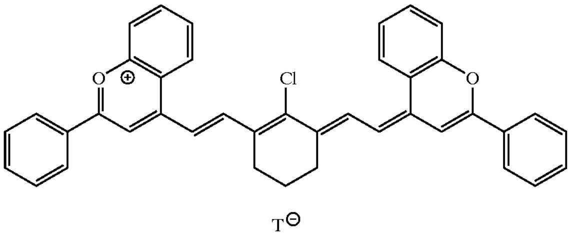
A-24
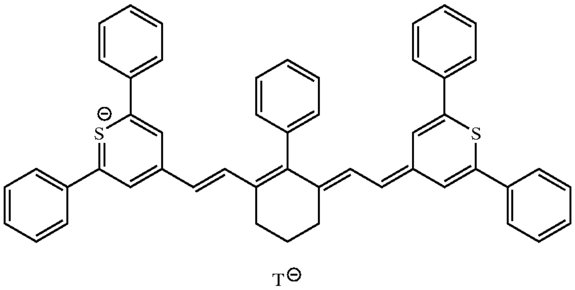
A-25
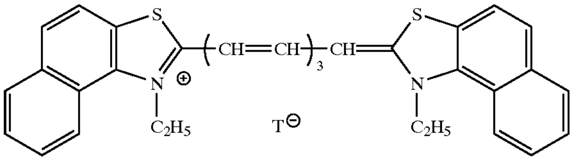
A-26
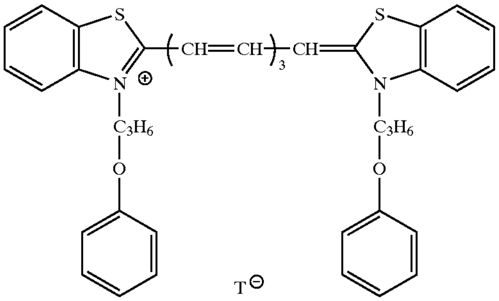
A-27
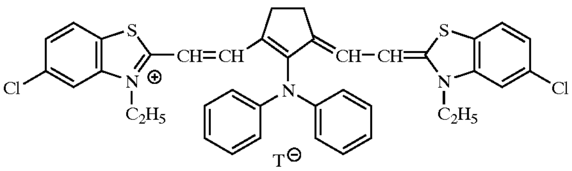
A-28
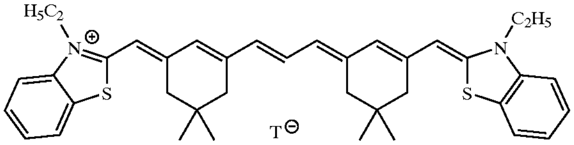
A-29
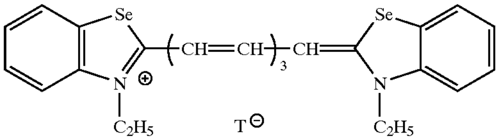
A-30
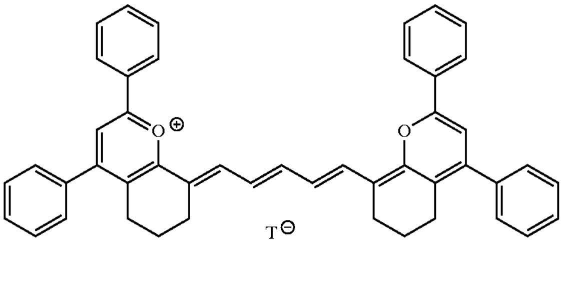
A-31
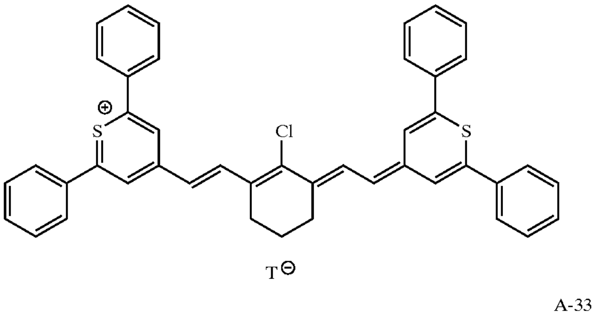
A-32
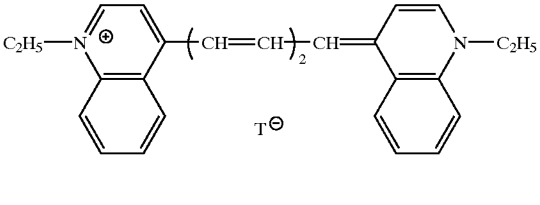
A-33
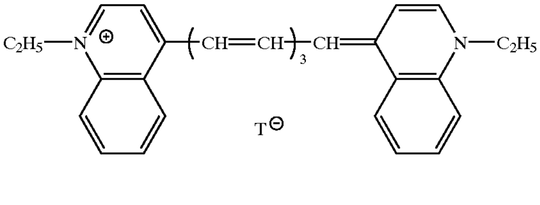

-continued
A-34
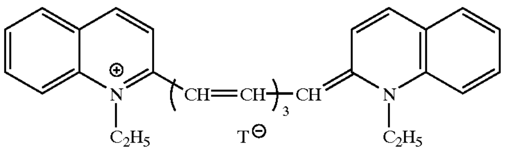
A-35
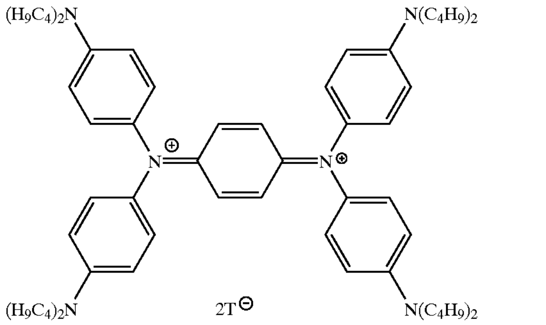
A-36
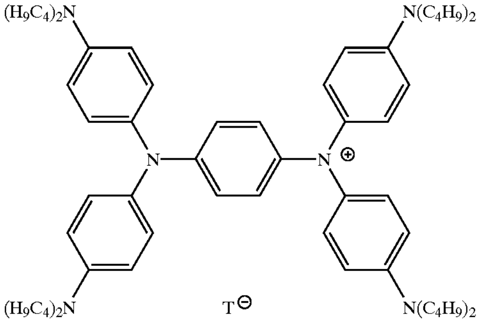
A-37
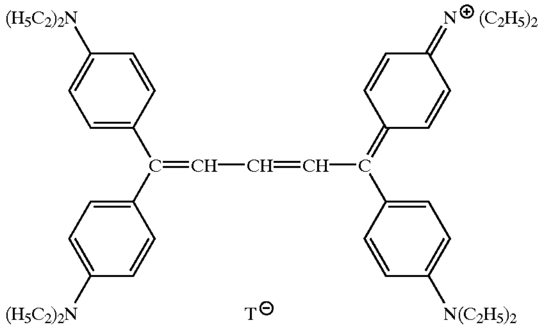
A-38
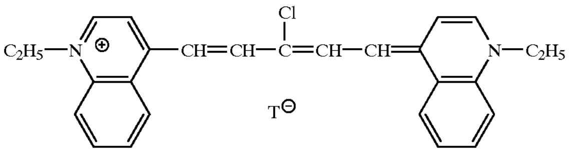
A-39
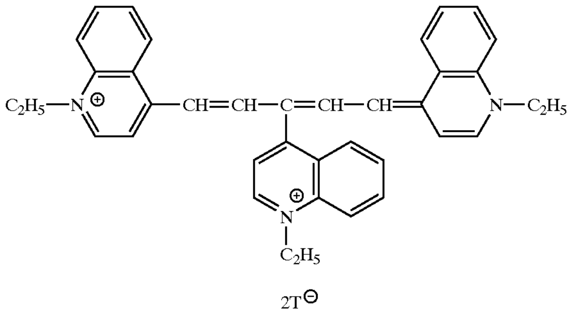
A-40
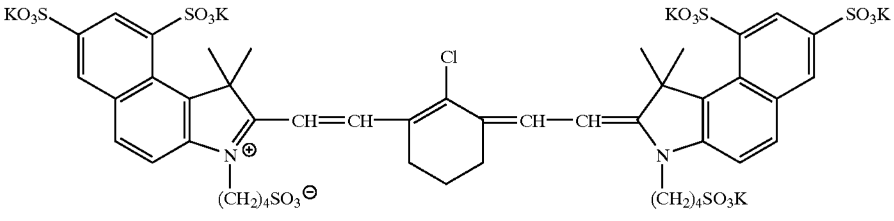
A-41
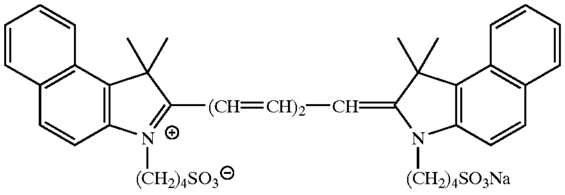
A-42
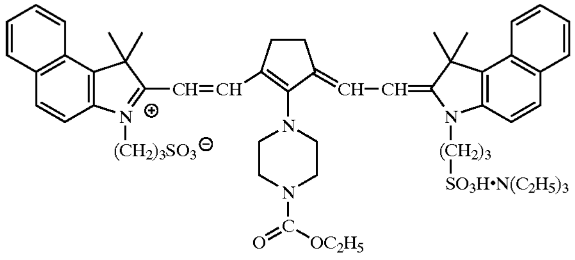

-continued
A-43
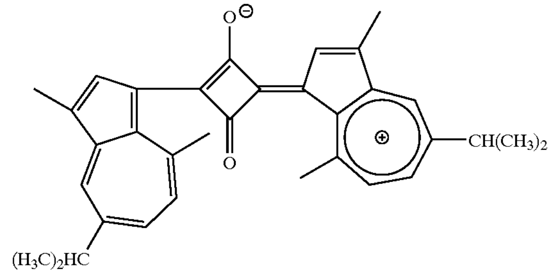
A-44
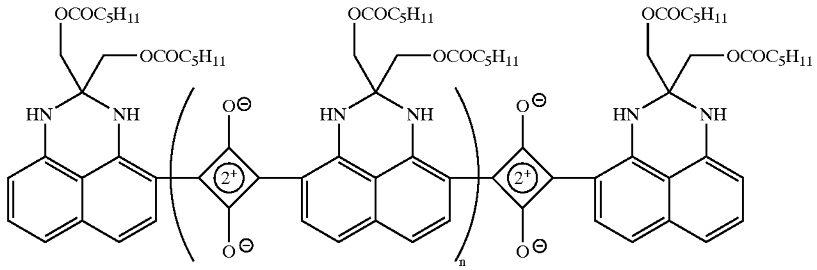
(n=1,2)
A-45
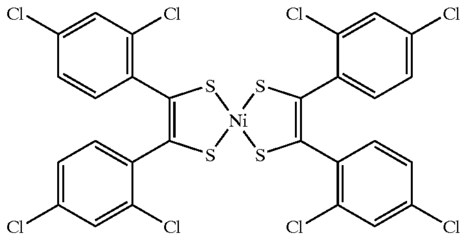
A-46
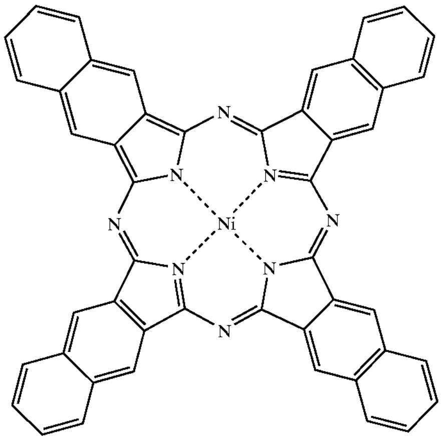
A-47
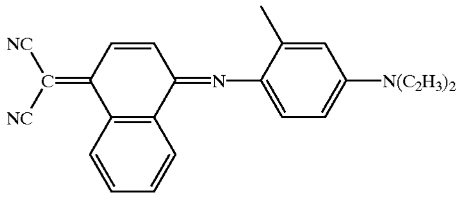
A-48
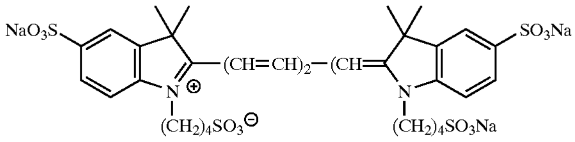
A-49
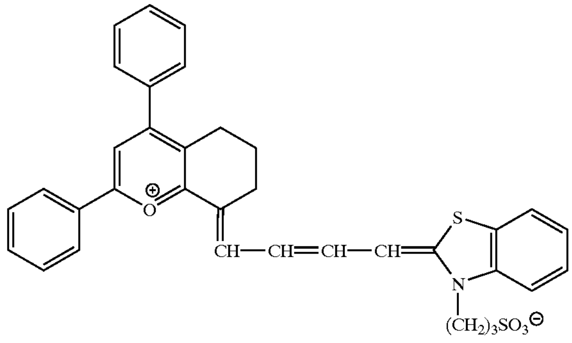
A-50
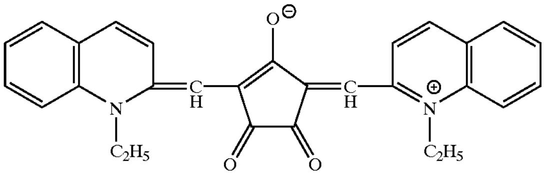

-continued

A-51

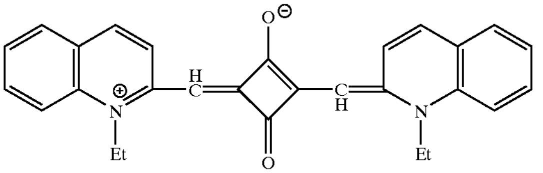

A-52

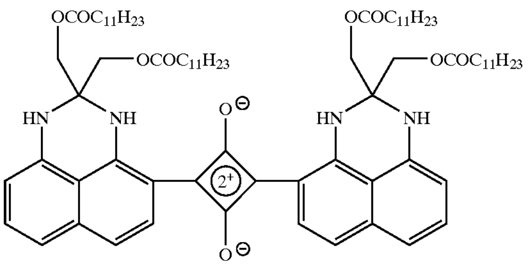

A-53

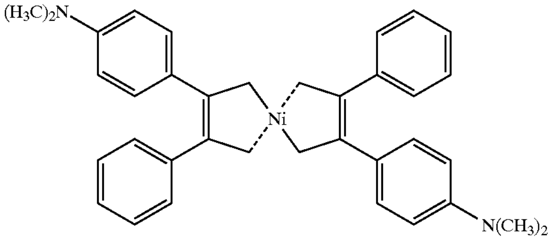

A-54

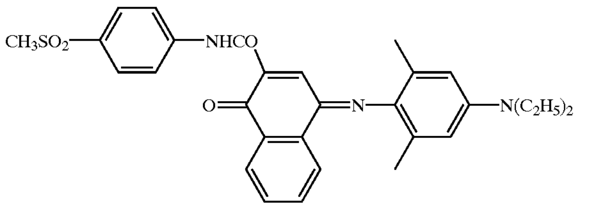

A-55

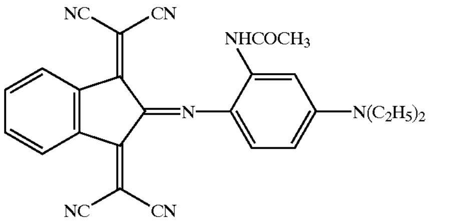

A-56

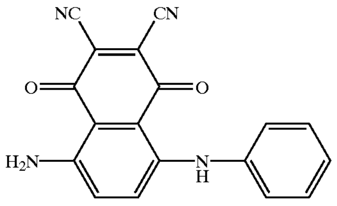

In the above-described structural formulae A-1 to A-56, $T^-$ represents a monovalent counter anion, preferably, a halogen anion ($F^-$, $C^-$, $Br^-$, $I^-$), a Lewis acid anion ($BF_4^-$, $PF_6^-$, $SbCl_6^-$, $ClO_4^-$), an alkylsulfonic acid anion, or an arylsulfonic acid anion.

The alkyl in the above-described alkylsulfonic acid means a linear, branched or cyclic alkyl group having 1 to 20 carbon atoms. Specific examples thereof include a methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Among these, linear alkyl groups having 1 to 12 carbon atoms, branched alkyl groups having 3 to 12 carbon atoms, and cyclic alkyl groups having 5 to 10 carbon atoms are more preferable.

The aryl in the above-described arylsulfonic acid is one which is formed of one benzene ring, one in which 2 or 3 benzene rings form a condensed ring, or one in which a benzene ring and 5-membered unsaturated ring form a condensed ring. Specific examples thereof include a phenyl group, naphthyl group, anthryl group, phenanthryl group, indenyl group, acenaphthenyl group, and fluorenyl group. Among these, a phenyl group and a naphthyl group are more preferable.

When the image forming material of the present invention is used as a positive-type, the amounts to be added of the above-mentioned infrared absorbents can be determined in the same way as that in the description of the negative-type image forming material.

In order to raise levels of sensitivity and development latitude, the positive-type recording layer pertaining to the present invention may contain a dye or pigment (an infrared absorbents that can be used in the negative-type image forming material described previously) other than the above-described cyanine dyes, pyrylium salts, and anionic dyes.

When the image forming material of the present invention is usedas a negative-type recording material whose solubility in an alkaline developing solution is reduced by infrared laser irradiation to a level necessary for image recording, recording layers and materials used in known negative-type recording materials may be used without particular restrictions other than with regard to the thickness and the amount of infrared absorbent contained in the recording layer.

In order to decrease the solubility of the alkali aqueous solution soluble polymeric compound in exposed portions, the negative-type recording layer contains an acid-generating agent, which is decomposed by light or heat and generates an acid, and a crosslinking agent which induces a crosslinking reaction in the presence of the acid so that the binder polymer is hardened. Alternatively, the negative-type recording layer contains a compound which generates a radical by light or heat and a compound which is polymerized and hardened by the radical thus created, and so on.

The acid-generating agent refers to a compound from which acids are released upon being irradiated with light having wavelengths ranging from 200 nm to 500 nm, or upon being heated to a temperature of 100° C. or higher. Examples of the acid-generating agent include known compounds which generate an acid by thermal decomposition such as a photoinitiator of photo-cationic polymerization, a photoinitiator of photo-radical polymerization, a photo-decolorizer of dyes, a photo-color-changer, known acid-generating agents and the like used in a microresist or the like, as well as mixtures of these compounds. As to the acid to be generated, a strong acid having a pKa of 2 or less such as sulfonic acid and hydrochloric acid is preferable.

Examples of acid-generating agents which can be suitably used in the present invention include onium salts such as iodonium salt, sulfonium salt, phosphonium salt, and diazonium salt. Specifically, the compounds described in U.S. Pat. No. 4,708,925 and JP-A No. 7-20629 may be used. Particularly, iodonium salts, sulfonium salts, and diazonium salts—all of which contain a sulfonate ion as a counter ion—are preferred. As to the diazonium salts, the diazonium compound described in U.S. Pat. No. 3,867,147, the diazonium compound described in U.S. Pat. No. 2,632,703, and the diazo resins described in JP-A Nos. 1-102456 and 1-102457 are also preferable. Examples of other preferable acid-generating agents include the benzyl sulfonates described in U.S. Pat. Nos. 5,135,838 and 5,200,544; the active sulfonate esters and disulfonyl compounds described in JP-A Nos. 2-100054 and 2-1000055 and Japanese Patent Application No. 8-9444; and haloalkyl-substituted S-triazines described in JP-A No. 7-271029.

These compounds may be used singly or in combinations of two or more species.

In the present invention, these acid-generating agents are added at a ratio of 0.01–50% by weight, more preferably at a ratio of 0.1–25% by weight, and most preferably at a ratio of 0.5–20% by weight, with respect to the total solid component of the recording layer. If the amount of the acid-generating agent is less than 0.01% by weight, images cannot be obtained, whereas if it is more than 50% by weight, undesirable stains are generated on the non-image portions during printing.

In addition to the methylol compounds, alkoxymethyl compounds, resol resins, and the like described in Japanese Patent Application No. 9-234406, examples of the acid cross-linking agent include the following compounds described in Japanese Patent Application No. 11-151412:

(i) aromatic compounds substituted by an alkoxymethyl group or a hydroxymethyl group;

(ii) compounds having an N-hydroxymethyl group, an N-alkoxymethyl group, or an N-acyloxymethyl group; and (iii) epoxy compounds.

Examples of the aromatic compounds (i) substituted by an alkoxymethyl group-or a hydroxymethyl group include aromatic compounds and heterocyclic compounds which are poly-substituted by hydroxymethyl groups, acetoxymethyl groups, or alkoxymethyl groups. The compounds represented by chemical formula 14 and the compounds represented by chemical formula 15 described in Japanese Patent Application No. 11-151412 are preferred. $L_1$ to $L_8$ in the chemical formulae each represents independently a hydroxymethyl group or alkoxymethyl group which is substituted by an alkoxy group having 18 or less carbon atoms and is exemplified by such group as methoxymethyl, ethoxymethyl, or the like.

Examples of the compounds (ii) having an N-hydroxymethyl group, an N-alkoxymethyl group, or an N-acyloxymethyl group include a monomer, oligomer-melamine-formaldehyde condensate as well as urea-formaldehyde condensate disclosed in EP Patent (hereinafter described as EP-A) No. 0,133,216, German Patent Nos. 3,634,671, 3,711,264, alkoxy-substituted compounds disclosed in EP-A No. 0,212,482, and the like.

Even more preferable examples include melamine-formaldehyde derivatives having at least two free N-hydroxymethyl groups, N-alkoxymethyl groups, or N-acyloxymethyl groups. Among them, an N-alkoxymethyl derivative is particularly preferable.

Examples of epoxy compounds (iii) include monomeric, dimeric, oligomeric, and polymeric epoxy compounds each having at least one epoxy group. Examples thereof include a reaction product of bisphenol A and epichlorohydrin and a reaction product of a phenol-formaldehyde resin having a low molecular weight and epichlorohydrin. Epoxy resins described and used in U.S. Pat. No. 4,026,705 and U. K. Patent No. 1,539,192 can also be listed.

Amounts of the crosslinking agents (i) to (iii) that can be used in the present invention are within the range of 5–80% by weight, preferably 10–75% by weight, and more preferably 20–70% by weight, based on the total weight of the solid components of the negative-type image recording layer. If the amount of the cross-linking agent is less than 5% by weight, the durability of the photo-sensitive layer of the planographic printing plate precursor deteriorates. Further, from the standpoint of stability during storage, an amount which exceeds 80% by weight is not preferable.

Further examples of the acid crosslinking agent, which crosslinks in the presence of an acid, include the phenol derivatives shown in paragraphs [0078] to [0084] of the aforementioned Japanese Patent Application No. 11-151, 412.

A variety of compounds other than those listed above may be added into the recording layer of the image forming material of the present invention, if necessary.

For example, dyes exhibiting an extensive absorption in the visible light range may be used as an image-coloring agent. Specific examples include Oil Yellow No. 101, Oil Yellow No. 103, Oil Pink No. 312, Oil Green BG, Oil Blue BOS, Oil Blue No. 603, Oil Black BY, Oil Black BS, and Oil Black T-505 (all manufactured by Orient Chemical Industries, Co., Ltd.), Victoria Pure Blue, Crystal Violet (CI42555), Methyl Violet (CI42535), Ethyl Violet, Rhodamine B(CI145170B), Malachite Green (CI42000), Methylene Blue (CI52015), and AIZEN SPILON BLUE C-RH (manufactured by Hodogaya Chemical Co., Ltd.), and the like as well as dyes described in JP-A No. 62-293247.

By adding these dyes, the distinction between image and non-image portions after image formation becomes clear. Therefore, it is preferable that these dyes be added. The amount of dye added is preferably within the range of 0.01–10% by weight, with respect to the total solid component of the recording layer.

In order to increase processing stability in relation to developing conditions, the image forming material of the present invention may contain a nonionic surfactant described in JP-A Nos. 62-251740 and 3-208514 and an amphoteric surfactant described in JP-A Nos. 59-121044 and 4-13149.

Specific examples of the nonionic surfactant include sorbitan tristearate, sorbitan monopalmitate, sorbitan trioleate, monoglyceride stearate, and polyoxyethylene nonylphenyl ether.

Specific examples of the amphoteric surfactant include alkyldi(aminoethyl)glycine, alkylpolyaminoethylglycine hydrochloride, 2-alkyl-N-carboxyethyl-N-hydroxyethylimidazolinium betaine, and N-tetradecyl-N, N-betaine (for example, Amogen K manufactured by Daiichi Kogyo Seiyaku Co., Ltd.).

The proportion of the nonionic surfactants and amphoteric surfactants to be contained in the recording layer is preferably 0.05–15% by weight, and more preferably 0.1–5% by weight.

A plasticizer may be added to the recording layer of the image forming material of the present invention in order to impart flexibility to the layer as the need arises. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and the like may be used.

In the image forming material of the present invention, the recording layer is generally formed by dissolving the above-described components in a solvent and coating the resultant solution on a suitable support having thereon a recording layer (intermediate layer) which has a higher sensitivity. The intermediate layer is described later.

Examples of usable solvents include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetarnide, N,N-dimethylformamide, tetramethylurea, N-methylpyrrolidone, dimethyl sulfoxide, sulfolane, γ-butyrolactone, toluene, and water. These solvents may be used singly or in combinations. The concentration of the above-described components in the solvent(the entirety of the solid components including additives) is preferably 1–50% by weight.

The coating amount (solid components), which varies in accordance with application, of the recording layer of the present invention is adjusted so that it falls within the range of 0.01 to 3.0 g/$m^2$.

Various methods can be employed as the method for coating. Examples include: bar coater coating, rotation coating, spray coating, curtain coating, dip coating, air knife coating, blade coating, and roll coating. As the coating amount becomes smaller, whereas apparent sensitivity increases, the film characteristics of the image recording layer deteriorate.

The recording layers of the present invention may contain a surfactant to improve the coating. For example, a fluorine-containing surfactant described in JP-A No. 62-170950, may be added. The amount is preferably 0.01–1% by weight, and more preferably 0.05–0.5% by weight based on the total solid component of the image recording layers.

Next, an intermediate layer, which is disposed between the support and the above-described recording layer and which has the same function as that of the recording layer but whose sensitivity to the effect of light or heat is higher than that of the recording layer (this intermediate layer is hereinafter referred to as "intermediate layer"), is explained. Preferably, this intermediate layer is directly formed on the support which optionally has an undercoat layer formed thereon.

In the intermediate layer of the present invention, recording materials whose sensitivity has been raised to a level higher than that of types of recording materials and which use the same basic image forming principle as the recording layers previously described may be used. For example, an intermediate layer formed of a radical polymer type having a high level of sensitivity may be formed on the support. A recording layer of an acid catalyst cross-linking type, having a low lever of sensitivity in comparison with the radical polymer, may then be provided on top of the intermediate layer. Combinations of different types of recording materials having structures such as this one may be used.

From the standpoint of fusibility at the boundary surface and production suitability, it is preferable for the intermediate layer to use, in the intermediate layer, types of recording materials which are the same as that of the recording layer.

Further, it is preferable that intermediate layer has a sensitivity to light or heat at least 1.3 times or greater than the recording layer. If the difference in sensitivity is less than 1.3 times, the effectiveness of the formation of the laminated structure is insufficient. The sensitivity of the recording layer and the sensitivity of the intermediate layer can be obtained by forming a single layer respectively and measuring the sensitivity of each single layer under the same condition.

Next, general methods (steps) for raising the level of sensitivity of the intermediate layer using the same recording material type as that of the recording layer are described. Examples of the method include: a method in which the level of sensitivity is raised by adjusting the developability of the binder forming the intermediate layer by such means as changing the hydrophilic or hydrophobic group to be introduced, or changing of the molecular weight; a method in which the level of sensitivity is raised by adjusting (increasing) the concentration of the photosensitive or heat-sensitive compound included in the intermediate layer; and a method in which the level of sensitivity is raised by adding a so-called sensitizing aid such as an infrared absorbent or the like capable of accelerating the reaction or physical change result from the effect of light or heat inside the intermediate layer. These methods are preferable for raising the level of sensitivity of the intermediate layer of the prevent invention. Further, any methods for raising the level of sensitivity, which include changing kinds or amounts of utilized materials, conditions of preparation, layer thickness, or the like, also can be applied for the intermediate layer.

The coating amount (solid component) of the intermediate layer of the present invention is varies depending on the application. However, it is preferable to be adjusted so that it falls with the range of 0.01 to 3.0 g/$m^2$ although it.

The support, to which the intermediate layer and the recording material of the present invention can be applied, is a dimensionally-stable, plate-shaped material. Examples of the support include paper, paper laminated with a plastic (e.g., polyethylene, polypropylene, polystyrene, etc.), metal plates (e.g., aluminum, zinc, copper, etc.), plastic films (e.g., cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, polyvinyl acetal, etc.), and paper or plastic films laminated or deposited with a metal such as one selected from among the above-mentioned metals.

Preferably, a polyester film or an aluminum plate is used as the support. An aluminum plate is particularly preferred due to its good dimension stability and comparatively low price. A pure aluminum plate and an aluminum-based alloy plate containing traces of elements dissimilar to aluminum are suitable. A plastic film laminated or vapor-deposited with aluminum can also be used. Examples of the dissimilar elements contained in the aluminum alloy include silicon, iron, manganese, copper, magnesium, chromium, zinc, bismuth, nickel, and titanium. The total amount of the dissimilar elements in the alloy is 10% by weight or less. Pure aluminum is particularly suitable for the present invention. However, because completely pure aluminum is extremely difficult to manufacture from the standpoint of refinement technology, aluminum which contains slightly different elements may also be used. The composition of the aluminum plate that may be suitably used in the present invention is not specifically defined, and a conventionally known and widely used aluminum plate may be suitably used. The thickness of the aluminum plate for use in the present invention is approximately 0.1–0.6 mm, preferably 0.15–0.4 mm, and more preferably 0.2–0.3 mm.

Before roughening the aluminum plate, a degreasing treatment, using a surfactant, an organic solvent, an alkali aqueous solution, or the like, may be performed to remove rolling oil from the surface.

The surface of the aluminum plate may be roughened by use of a variety of methods. Examples include mechanical roughening, electrochemical dissolving and roughening of the surface, and chemical dissolving of selected surface portions. Mechanical methods that may be used include known methods such as a ball abrasion method, a brush abrasion method, a blast abrasion method, a buff abrasion method, and others. An electrochemical roughening method may be performed by passing an alternating current or direct current in an electrolyte solution containing hydrochloric acid or nitric acid. Alternatively, a method combining both may be used as disclosed in JP-A No. 54-63902

The thus-roughened aluminum plate, after being subjected to an alkali etching treatment and a neutralizing treatment as the necessity arises, may also be subjected to an anodization treatment in order to raise the water retention and abrasion resistance of the surface. Various kinds of electrolytes which form porous oxide film may be employed as the electrolyte used in the anodization treatment of the aluminum plate. In general, sulfuric acid, phosphoric acid, oxalic acid, chromic acid, and mixtures thereof may be used. The concentration of the electrolyte is suitably determined in accordance with the species of the electrolyte.

The processing conditions for anodizing the plate vary in accordance with the electrolyte employed, and therefore cannot be specified unconditionally. However, suitable conditions are generally such that the concentration of the electrolyte solution is 1–80% by weight, liquid temperature is 5–70° C., current density is 5–60 A/dm$^2$, voltage is 1–100V, and duration of electrolysis is from 10 seconds to 5 minutes. When the amount of the anodized film is less than 1.0 g/m$^2$, plate life is insufficient or non-image portions become scratched more easily. Particularly in the case of a planographic printing plate precursor, so-called "scratch contamination," or the adhesion of ink to scratched portions at the time of printing, occurs more easily.

Depending on the necessity, the surface of the aluminum plate may be subjected to a hydrophilization treatment after the anodization treatment has been conducted. Examples of the hydrophilization treatment that may be used in the present invention include a method making use of an alkali metal silicate (e.g., an aqueous sodium silicate solution) such as those disclosed in U.S. Pat. Nos. 2,714,066, 3,181,461, 3,280,734, and 3,902,734. According to this method, a support is treated by immersion in an aqueous sodium silicate solution or electrolysis. Other usable methods include method in which a surface is treated with an aqueous solution of potassium fluorozirconate disclosed in JP-B No. 36-22063 and the method in which a surface is treated with an aqueous solution of polyvinylphosphonic acid as disclosed in U.S. Pat. Nos. 3,276,868, 4,153,461, and 4,689,272.

Prior to coating the support with the recording layer (intermediate layer), an undercoat layer may be provided on the support, if necessary.

A variety of organic compounds may be used as the components of the undercoat layer. Examples include, the organic compounds are selected from carboxymethyl cellulose; dextrin; gum arabic; phosphonic acids having an amino group such as 2-aminoethylphosphonic acid; organic phosphonic acids such as phenylphosphonic acid, naphthylphosphonic acid, alkylphosphonic acid, glycerophosphonic acid, methylenediphosphonic acid, and ethylenediphosphonic acid, each of which may have at least one of substituent; organic phosphoric acids such as phenylphosphoric acid, naphthylphosphoric acid, alkylphosphoric acid, and glycerophosphoric acid, each of which may have at least one of substituent; organic phosphinic acids such as phenylphosphinic acid, naphthylphosphinic acid, alkylphosphinic acid, and glycerophosphinic acid, each of which may have at least one of substituent; amino acids such as glycine and β-alanine; and hydrochlorides of amines having a hydroxyl group such as triethanolamine hydrochloride. These compounds may be used in combinations of two or more. In addition, the use of the previously described diazonium compound as an undercoat is also preferable.

The coating amount of the organic undercoat layer is suitably 2–200 mg/m$^2$, and preferably 5–100 mg/m$^2$. If the coating amount is less than 2 mg/m$^2$, sufficient film properties cannot be obtained, whereas, if it is over 200 mg/m$^2$, the same phenomenon occurs.

A plate can be provided with this organic undercoat layer in accordance with methods such as the following. In one such method, the aforementioned organic compounds are dissolved in water or an organic solvent of methanol, ethanol, methyl ethyl ketone or the like, or mixed solvents of these. The surface of the aluminum plate is then coated with the resultant solution and dried, whereby the plate is provided with an organic undercoat layer. In another method, the aforementioned organic compounds are dissolved in water or an organic solvent of methanol, ethanol, methyl ethyl ketone or the like, or mixed solvents of these. The aluminum plate is then immersed in the resultant solution and made to adsorp the aforementioned compounds. Afterwards, the plate is cleansed with water or the like and dried, whereby the plate is provided with an organic undercoat layer. In the former method, a solution of the above-described organic compound in a concentration ranging from 0.005 to 10% by weight can be applied by various methods. In the latter method, the concentration of the solution is 0.01–20% by weight, preferably 0.05–5% by weight; the immersion temperature is 20–90° C., preferably 25–50° C.; and the immersion time is 0.1 second to 20 minutes, preferably 2 seconds to 1 minute. The pH range of the solution to be used may be adjusted to 1–12 by a basic substance such as ammonia, triethylamine, potassium hydroxide or the like, or by an acidic substance such as hydrochloric acid, phosphoric acid or the like. It is also possible to add a yellow dye so as to improve tone reproducibility when the recording layer of the present invention is used as a planographic printing plate precursor.

Accordingly, the image forming material of the present invention can be used as a planographic printing plate precursor. It is preferable that the image forming material is recorded with an infrared laser. As stated previously, it is preferable that the material is recorded with a high-output infrared laser having an energy density of 15000 mJ/s cm$^2$ per beam or greater, and more preferably 20000 mJ/s cm$^2$ per beam or greater. Specifically, it is preferable that the image is exposed with a solid-state laser or a semiconductor laser which emits an infrared ray having a wavelength ranging from 760 nm to 1200 nm. The energy density is a value which is determined by the output for each beam on the surface of the image forming material and the area of the beam on the surface of the recording layer. For example, if the energy strength is 38 mW and the plate area is a 1.5 μm-square, the energy density of the laser is 17000 mJ/s cm$^2$.

In the case where the image forming material of the present invention has a positive-type or negative type recording layer, development processing is carried out with water or an alkali developing solution after exposure. Although the development processing may be carried out immediately after exposure, a thermal treatment may be performed between the exposure step and the development step. When conducting a thermal treatment, it is preferable that the temperature is within a range of 60–150° C. and that the duration is from 5 seconds to 5 minutes. Various conventionally-known heating methods can be employed. For example, in one such method, the recording material is heated with a panel heater or a ceramic heater while being held in contact with the heater. In another method, the recording material is heated with a lamp or hot air without contact. This thermal treatment makes it possible to reduce laser energy required for recording during laser irradiation.

When an alkaline aqueous solution is used, a conventionally known alkali aqueous solution may be used as the developing solution or replenisher solution. For example, inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide may be used. In addition, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine may be used.

These alkali agents can be used singly or in combinations of two or more.

Among these alkali agents, an example of a particularly preferred developing solution is an aqueous solution of a silicate such as sodium silicate or potassium silicate. This is because it becomes possible to adjust developability depending on the ratio and concentration of silicon oxide $SiO_2$ to alkali metal oxide $M_2O$ (M represents an alkali metal), which are components of the silicate. For example, alkali metal silicates such as those described in JP-A No. 54-62004 and JP-B No. 57-7427 can be used effectively.

When an automatic developing apparatus is used for carrying out development, it is known that a large amount of recording layers can be processed without replacing the developing solution in the developer tank for a long period of time by adding an aqueous solution (replenisher solution) whose alkalinity is higher than that of the developing solution, to the developing solution. This replenishing system is suitably used in the present invention, too.

The recording layer, having been subjected to development processing using the aforementioned developing solution and replenishing solution, is then subjected to post-processing with a rinse liquid containing rinse water, surfactants and the like, and a desensitizing solution containing gum arabic and a starch derivative. A combination of these processes may be used as a post-treatment when the recording layer of the present invention is used as a printing material in plate.

In recent years, particularly in the plate-making and printing industries, automatic developing apparatuses for plate materials in printing have been widely used in order to rationalize and standardize plate making operations.

This automatic developing machine generally has a developing section and a post-processing section, and includes a device to convey plate material in printing, tanks containing respective processing liquids, and spray devices. While the printing plate for which exposure has been completed is horizontally conveyed, the machine sprays from a spray nozzle processing liquid drawn up by a pump, thereby effecting development processing. Recently, another method has come to be known in which the plate material in printing is immersed in a processing tank filled with processing liquid and conveyed by guide rollers and the like submersed within the liquid, whereby processing is effected. In such automatic processing, processing can be effected while the replenishing solution is replenished in accordance with processing amounts, operational times, and the like of the respective processing liquids.

In addition, the so-called disposable processing method in which processing is effected with substantially unused processing solutions may also be suitably used.

In the case where the obtained image forming material is used as a planographic printing plate, the planographic printing plate may be coated with a desensitizing gum if necessary, and subsequently forwarded to a printing process. When even longer plate life is desired, the planographic printing plate may be subjected to a burning treatment.

When the planographic printing plate undergoes burning, the plate is treated preferably with a counter-etching solution described, for example, in JP-B Nos. 61-2518 and 55-28062, and JP-A Nos.62-31859 and 61-159655, before burning.

A planographic printing plate that has been coated with a counter-etching solution is dried, then heated if necessary to a high temperature by means of a burning processor (e.g., BP-1300 a burning processor marketed by Fuji Photo Film Co., Ltd.)and the like. Although the heating temperature and duration depend on the types of components forming the image, preferred ranges for the temperature and duration are 180–300° C. and 1–20 minutes, respectively.

If necessary, a planographic printing plate that has undergone a burning treatment may be subjected to conventionally employed treatments such as water-rinsing and gumming up. When a counter-etching solution containing a water-soluble polymeric compound or the like is used, a so-called desensitizing treatment such as gumming up may be omitted.

The planographic printing plate obtained by such treatments is set to an offset printing machine or the like and used for printing a large number of prints.

EXAMPLES

The present invention will now be described in detail with reference to examples. However, the present invention is not limited to these examples.

Support Making

An aluminum plate (material 1050) having a thickness of 0.30 mm was degreased by washing with trichloroethylene. Thereafter, the surface of the plate was grained by use of a nylon brush and an aqueous suspension of a 400-mesh powder of pumice stone, then washed with water sufficiently. The plate was etched upon being immersed in a 25% sodium hydroxide aqueous solution at 45° C. for 9 seconds and washed with water. The plate was further immersed in 2% $HNO_3$ aqueous solution for 20 seconds and washed with water. The etching amount of the grained surface at this time was about 3 $g/m^2$. Subsequently, the aluminum plate was provided with an anodically oxidized film of 3 $g/m^2$ by using 7% $H_2SO_4$ aqueous solution as an electrolyte solution and a d. c. current at a current density of 15A g/$dm^2$. The aluminum plate was then washed with water and dried. Thereafter, the aluminum plate was coated with the following undercoat liquid, and dried at 80° C. for 30 seconds. The coating amount after drying was 10 $gM^2$.

| [Undercoat liquid] | |
|---|---|
| β-alanine | 0.10 g |
| methanol | 40.0 g |
| pure water | 60.0 g |

Examples 1 to 5: Negative-type Image Forming Materials

The supports were coated with solutions having the following compositions for forming negative-type intermediate layers, and dried at 100° C. for 3 minutes. The coating weight after drying was 0.5 g/$m^2$. Subsequently, the supports were coated, respectively, with solutions having the following compositions for forming negative-type layers (acid catalyst-crosslinking layers), and dried at 130° C. for 30 seconds so as to obtain negative-type image forming materials. In this way, Examples 1 to 5 were carried out. The total coating weight after drying was 2.0 g/$m^2$.

| (Solution 1 for forming negative-type intermediate layer) | |
|---|---|
| Crosslinking agent of Table 1 | 0.8 g |
| Polymer of Table 1 | 1.5 g |
| Acid-generating agent [Z] of Table 1 | 0.20 g |
| Infrared absorbent [A] of Table 1 | 0.30 g |
| Fluorine-containing surfactant | 0.06 g |
| (Megafac F-177, manufactured by Dainippon Ink and Chemicals Inc.) | |
| Methyl ethyl ketone | 10.0 g |
| γ-butyrolactone | 10.0 g |
| 1-methoxy-2-propanol | 7.0 g |

| (Solution 1 for forming negative-type recording layer (acid catalyst-crosslinkable layer)) | |
|---|---|
| Crosslinking agent [X] of Table 1 | 0.8 g |
| Polymer [Y] of Table 1 | 1.5 g |
| Acid-generating agent [Z] of Table 1 | 0.20 g |
| Infrared absorbent [A] | 0.15 g |
| Coloring agent | 0.015 g |
| (AIZEN SPILON BLUE C-RH, manufactured by Hodogaya Chemical Co., Ltd.) | |
| Fluorine-containing surfactant | 0.06 g |
| (Megafac F-177, manufactured by Dainippon Ink and Chemicals Inc.) | |
| Ethyl acetate | 15.0 g |
| Methanol | 5.0 g |

(A-57)

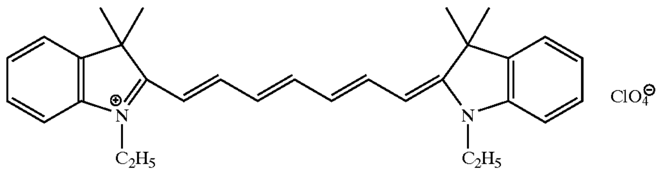

(A-58)

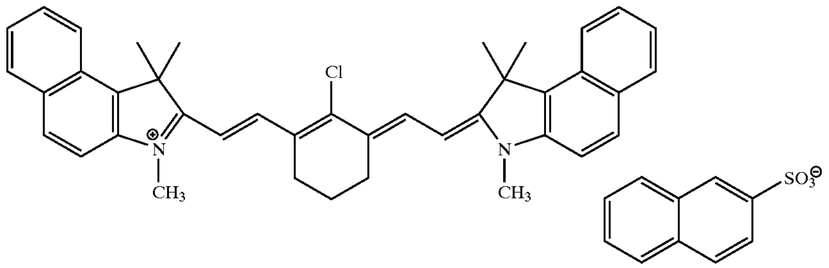

(B-1)

Resol resin (Mw: 5000)

-continued

| (Solution 1 for forming negative-type recording layer (acid catalyst-crosslinkable layer)) |
| --- |

(B-2)

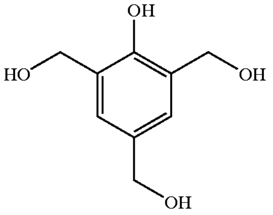

(B-3)

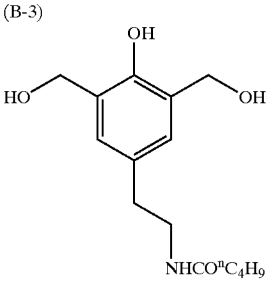

(c-1) p-octyl phenol/m-cresol (20 parts by weight/80 parts by weight)/formalin condensate novolak (Mw: 10000)

(c-2) p-hydroxystyrene/methyl methacrylate (20 parts by weight/80 parts by weight) copolymer (Mw: 30000)

(C-3)

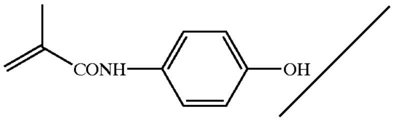

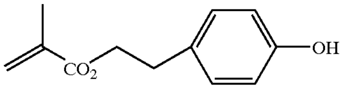

(20 parts by weight/80 parts by weight) copolymer (Mw: 50000)

(X-1)

Resol resin (Mw: 3000)

(X-2)

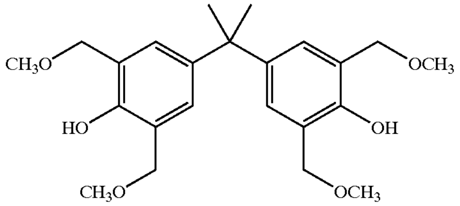

(X-3)

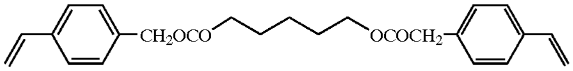

-continued (X-4)

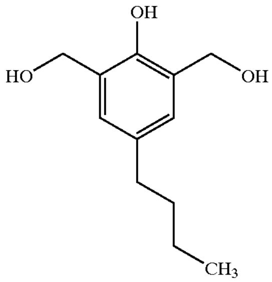

(Y-1) Phenol/formalin condensate novolak (Mw: 30000)

(Y-2) p-hydroxystyrene (Mw: 50000)

(Y-3)

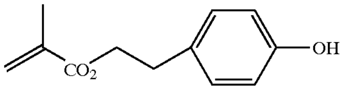

homopolymer (Mw: 20000)

(Z-1)

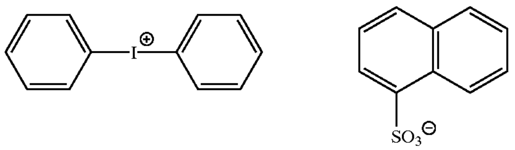

-continued (Z-2)

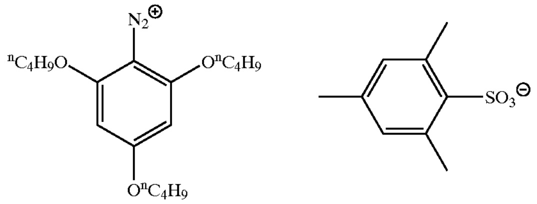

TABLE 1

| | Crosslinking agent of recording layer | Polymer of recording layer | Acid-generating agent | Infrared absorbent | Crosslinking agent of intermediate layer | Polymer of intermediate layer |
|---|---|---|---|---|---|---|
| Example 1 | X-1 | Y-1 | Z-1 | A-57 | B-1 | C-1 |
| Example 2 | X-2 | Y-2 | Z-1 | A-57 | B-2 | C-1 |
| Example 3 | X-3 | Y-1 | Z-2 | A-58 | B-3 | C-2 |
| Example 4 | X-4 | Y-1 | Z-2 | A-58 | B-1 | C-3 |
| Example 5 | X-4 | Y-3 | Z-2 | A-58 | B-1 | C-1 |

Comparative Examples 1 to 5

The supports, having been provided with the same above-described undercoat as in Example 1, were coated with the solutions 1 for forming recording layers (acid catalyst-crosslinkable layers), wherein crosslinking agents, polymers, infrared absorbents, etc, had been comprised in accordance with Table 2, and dried at 100° C. for 3 minutes so as to obtain a recording material formed of only a recording layer having a single composition on the support. In this way, Comparative Examples 1 to 5 were carried out. The total coating weight after drying was 1.5 g/m$^2$.

TABLE 2

| | Crosslinking agent of recording layer | Polymer of recording layer | Acid-generating agent | Infrared absorbent |
|---|---|---|---|---|
| Comparative Example 1 | X-1 | Y-1 | Z-1 | A-57 |
| Comparative Example 2 | X-2 | Y-2 | Z-1 | A-57 |
| Comparative Example 3 | X-3 | Y-1 | Z-2 | A-58 |
| Comparative Example 4 | X-4 | Y-1 | Z-2 | A-58 |
| Comparative Example 5 | X-4 | Y-3 | Z-2 | A-58 |

Comparative Examples 6 to 10

The supports, having been provided with the same above-described undercoat as in Example 1, were coated with the solutions 1 for forming intermediate layers, wherein crosslinking agents, polymers, infrared absorbents, etc. has been changed in accordance with Table 3, then dried at 100° C. for 3 minutes so as to obtain a recording materials formed of only a recording layer having a single composition whose sensitivity was higher than that of the recording layers in Comparative Examples 1 to 5. In this way, Comparative Examples 6 to 10 were carried out. The total coating weight after drying was 0.5 g/m$^2$.

TABLE 3

| | Acid-generating agent | Infrared absorbent | Crosslinking agent of intermediate layer | Polymer of intermediate layer |
|---|---|---|---|---|
| Comparative Example 6 | Z-1 | A-57 | B-1 | C-1 |
| Comparative Example 7 | Z-1 | A-57 | B-2 | C-1 |
| Comparative Example 8 | Z-2 | A-58 | B-3 | C-2 |
| Comparative Example 9 | Z-2 | A-58 | B-1 | C-3 |
| Comparative Example 10 | Z-2 | A-58 | B-1 | C-1 |

Examples 6 to 10:Positive-type Image Forming Materials

The supports, having been provided with the same above-described undercoat as in Example 1, were coated with the solutions 2 for forming positive-type intermediate layers, and dried at 100° C. for 3 minutes. The coating weight after drying was 0.5 g/m$^2$. Subsequently, the supports were coated, respectively, with the solutions 2 for forming heat-sensitive, positive-type recording layers, and dried at 130° C. for 30 seconds. The total coating weight after drying was 2.0 g/m$^2$.

| (Solution 2 for forming a positive-type intermediate layer) | |
|---|---|
| Polymer of Table 4 | 2.0 g |
| Infrared absorbent of Table 4 (in amount (g) in accordance with Table 4) | |
| Additive of Table 4 (in amount (g) in accordance with Table 4) | |
| Fluorine-containing surfactant (Megafac F-177, manufactured by Dainippon Ink and Chemicals Inc.) | 0.06 g |

-continued

| (Solution 2 for forming a positive-type intermediate layer) | |
|---|---|
| Methyl ethyl ketone | 10.0 g |
| γ-butyrolactone | 10.0 g |
| 1-methoxy-2-propanol | 7.0 g |

| (Solution 2 for forming a heat-sensitive, positive-type recording layer) | |
|---|---|
| Polymer [P] of Table 4 | 2.0 g |
| Infrared absorbent [A] of Table 4 | 0.15 g |
| Coloring agent (AIZEN SPILON BLUE C-RH, manufactured by Hodogaya Chemical Co., Ltd.) | 0.015 g |
| Fluorine-containing surfactant (Megafac F-177, manufactured by Dainippon Ink and Chemicals Inc.) | 0.06 g |
| Ethyl acetate | 15.0 g |
| Methanol | 15.0 g |

(P-1) m-cresol/p-cresol (60 weight %/40 weight %)/formalin condensate novolak (Mw: 10000)

(P-2) 3,5-xylenol/m-cresol (50 weight %/50 weight %)/formalin condensate novolak (Mw: 5000)

(P-3) m-cresol/formalin condensate novolak resin (Q-1)

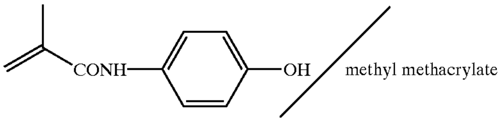

a mixture composed of 50 parts of an above copolymer (50 weight %/50 weight %) (Mw: 40000) and 50 parts of binder (P-1)

(Q-2)

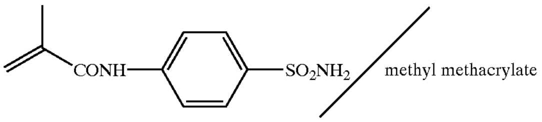

a mixture composed of 50 parts of an above copolymer (50 weight %/50 weight %) (Mw: 50000) and 50 parts of binder (P-1)

(Q-3)

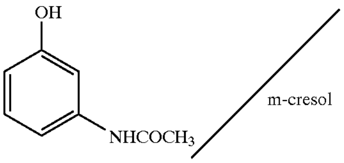

a formalin condensate novolak resin (50 weight %/50 weight %) (Mw: 20000)

(S-1)

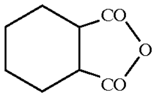

(S-2)

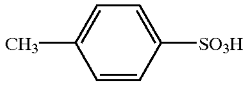

(R-1)

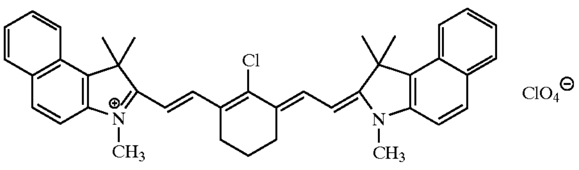

(R-2)

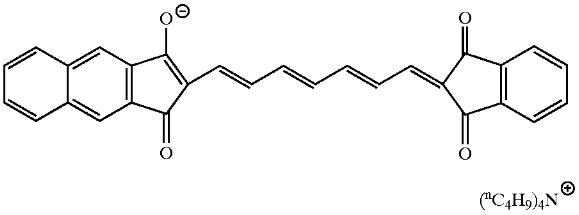

(R-3)

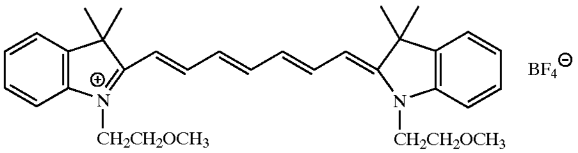

TABLE 4

| | Polymer of recording layer | Polymer of intermediate layer | Infrared absorbent (amount added) (g) | Additive (amount added) (g) |
|---|---|---|---|---|
| Example 6 | P-1 | Q-1 | R-1 (0.2) | S-1 (0.1) |
| Example 7 | P-2 | Q-1 | R-1 (0.2) | S-1 (0.1) |
| Example 8 | P-1 | Q-1 | R-2 (0.3) | S-2 (0.2) |
| Example 9 | P-2 | Q-2 | R-3 (0.3) | S-2 (0.2) |
| Example 10 | P-3 | Q-3 | R-3 (0.2) | None |

Comparative Examples 11 to 15

The supports, having been provided with the same above-described undercoat as in Example 1, were coated with the solutions 2 for forming heat-sensitive, positive-type recording layers, wherein crosslinking agents, polymers, infrared absorbents, etc. were comprised in accordance with Table 5, and dried at 100° C. for 3 minutes so as to obtain recording materials formed only a recording layer having of a single composition. In this way, Comparative Examples 11 to 15 were carried out. The total coating weight after drying was 1.5 g/m$^2$.

TABLE 5

| | Polymer of recording layer | Infrared absorbent |
|---|---|---|
| Comparative Example 11 | P-1 | R-1 |
| Comparative Example 12 | P-2 | R-1 |
| Comparative Example 13 | P-1 | R-2 |
| Comparative Example 14 | P-2 | R-3 |
| Comparative Example 15 | P-3 | R-3 |

Comparative Examples 1.6 to 20

The supports, having been provided with the same above-described undercoat as in Example 1, were coated with the solutions 2 for forming positive-type intermediate layers, wherein crosslinking agents, polymers, infrared absorbents, etc. were comprised in accordance with Table 6, then dried at 100° C. for 3 minutes so as to obtain recording materials formed of only a recording layer having of a single composition whose sensitivity was higher than that of the recording layers in Comparative Examples 11 to 15, respectively. In this way, Comparative Examples 16 to 20 were carried out. The coating weight after drying was 0.5 g/m$^2$.

TABLE 6

| | Polymer of intermediate layer | Infrared absorbent (amount added) (g) | Additive (amount added) (g) |
|---|---|---|---|
| Comparative Example 16 | Q-1 | R-1 (0.2) | S-1 (0.1) |
| Comparative Example 17 | Q-1 | R-1 (0.2) | S-1 (0.1) |
| Comparative Example 18 | Q-1 | R-2 (0.3) | S-2 (0.2) |
| Comparative Example 19 | Q-2 | R-3 (0.3) | S-2 (0.2) |
| Comparative Example 20 | Q-3 | R-3 (0.2) | None |

<Evaluation of the Adhesion of Negative-type Photosensitive Materials: Plate Life of Small Dots>

The obtained negative-type, image forming materials of Examples 1 to 5 and Comparative Examples of 1 to 10 were exposed and scanned by a semiconductor laser emitting infrared rays in the wavelength range of about 830 to 850 nm so as to form 1% dots (highlight). After the exposure, the exposed materials were thermally treated at 120° C. for 60 seconds by a panel heater and then processed with a developing solution DP-4 manufactured by Fuji Photo Film Co., Ltd. (which was diluted with water at a ratio of 1:8). By using the thus-processed photosensitive materials as printing plates, prints were produced using a Hidel KOR-D printer. The numbers of prints produced were compared as indicators of adhesion by regarding a practically desirable level as the standard (100). An indicator of 100 or greater is regarded as good and desirable from the standpoint of manufacture.

<Evaluation of the Elimination of Remnant Film of the Positive-type Sensitive Materials: Smudging During Printing>

The obtained positive-type image forming materials of Examples 6 to 10 and Comparative Examples of 11 to 20 were exposed and scanned by a semiconductor laser emitting infrared rays in the wavelength range of about 830 to 850 nm so as to form 99% dots (shadow). After the exposure, the exposed materials were processed with a developing solution DP-4 manufactured by Fuji Photo Film Co., Ltd. (which was diluted with water at a ratio of 1:8). By using the thus-processed photosensitive materials as printing plates, smudging in non-image portions was examined using a Hidel KOR-D printer.

<Evaluation of Storage Stability>

The respective image forming materials before exposure to laser were left in a highly humid condition (85% RH, 35° C.) for 3 days, then exposed to laser in the same way as above, and the amount of energy required for recording was calculated. In this way, the energy ratio (energy required after the storage in a highly humid condition/energy required before the storage in a highly humid condition) was calculated.

An energy ratio, 1.1 of less is desirable from the standpoint of manufacture and can be said to have good storage stability.

These results are shown in Tables 7 and 8.

TABLE 7

| | Adhesion (plate life indicator) | Storage stability (ratio of sensitivities) |
|---|---|---|
| Example 1 | 110 | 1.1 |
| Example 2 | 120 | 1.0 |
| Example 3 | 130 | 1.0 |
| Example 4 | 130 | 1.0 |
| Example 5 | 120 | 1.0 |
| Comparative Example 1 | 80 | 1.1 |
| Comparative Example 2 | 80 | 1.0 |
| Comparative Example 3 | 60 | 1.0 |
| Comparative Example 4 | 70 | 1.0 |
| Comparative Example 5 | 80 | 1.0 |
| Comparative Example 6 | 80 | 2.0 |
| Comparative Example 7 | 90 | 1.6 |
| Comparative Example 8 | 100 | 1.8 |
| Comparative Example 9 | 90 | 1.6 |
| Comparative Example 10 | 100 | 1.6 |

TABLE 8

| | Remnant film (smudging during printing) | Storage stability (ratio of sensitivities) |
|---|---|---|
| Example 6 | None | 1.1 |
| Example 7 | None | 1.0 |
| Example 8 | None | 1.0 |
| Example 9 | None | 1.1 |
| Example 10 | None | 1.0 |
| Comparative Example 11 | Smudging | 1.1 |
| Comparative Example 12 | Smudging | 1.0 |
| Comparative Example 13 | Smudging | 1.0 |
| Comparative Example 14 | Smudging | 1.1 |
| Comparative Example 15 | Smudging | 1.0 |
| Comparative Example 16 | None | 1.8 |
| Comparative Example 17 | None | 1.6 |
| Comparative Example 18 | None | 1.7 |
| Comparative Example 19 | None | 1.5 |
| Comparative Example 20 | None | 1.6 |

As is apparent from Tables 7 and 8, the negative-type image forming materials of the present invention were excellent in the adhesion of image portions, the positive-type image forming materials of the present invention were free from smudging of non-image portions, and both types produced high-quality images. Further, even when placed in a highly-humid environment, a drop in the sensitivity level was not observed, and the materials were found to have excellent storage stability.

As described above, the image forming materials of the present invention can be recorded directly from digital data of a computer or the like by using a solid-state laser or semiconductor laser emitting infrared rays. In addition, these image forming materials produce high-quality images and have excellent storage stability.

What is claimed is:

1. An image forming material, comprising:

(a) a support;

(b) a recording layer disposed on the support, the recording layer including at least one composition having a solubility in water or an alkali aqueous solution that is changed when subjected to light or heat so that the recording layer has a solubility in water or the alkali aqueous solution that is changed when subjected to light or heat; and (c) an intermediate layer disposed between the support and the recording layer, the intermediate layer including at least one composition having a solubility in the same one of water or the alkali aqueous solution as the composition included in the recording layer, which solubility of the compound included in the intermediate layer is changed when subjected to light or heat, wherein the change in solubility of the intermediate layer in water or the alkali aqueous solution when the intermediate layer is subjected to light or heat is greater than that of the recording layer when the recording layer is subjected to light or heat, said image forming material further comprising an infrared absorbent to permit forming an image using an infrared laser.

2. The image forming material of claim 1, wherein the infrared laser is a solid-state laser or semiconductor laser emitting an infrared ray having a wavelength ranging from 760 to 1200 nm.

3. The image forming material of claim 1, wherein the intermediate layer has a sensitivity to light or heat at least 1.3 times greater than the recording layer.

4. The image forming material of claim 1, wherein the image forming material is a photosensitive or heat-sensitive image forming material, and is a negative working image forming material.

5. The image forming material of claim 4, wherein at least one of the recording and intermediate layers includes a compound which crosslinks in the presence of an acid, and another compound which generates an acid when subjected to heat or light.

6. The image forming material of claim 4, wherein at least one of the recording and intermediate layers include a polymer having on the side chain or main chain thereof an aromatic hydrocarbon ring to which a hydroxyl group or alkoxy group is directly bonded.

7. The image forming material of claim 6, wherein the aromatic hydrocarbon ring is at least one selected from the group consisting of a benzene ring, a naphthalene ring, and an anthracene ring.

8. The image forming material of claim 1, wherein the image forming material is a photosensitive or heat-sensitive image forming material, and is a positive working image forming material.

9. The image forming material of claim 8, wherein the infrared absorbent includes at least one material selected from the group consisting of an anionic infrared absorbent, a cyanine dye, and a pyrylium salt.

10. The image forming material of claim 8, wherein at least one of the recording and intermediate layers include an onium salt infrared absorbent.

11. The image forming material of claim 1, wherein at least one of the recording and intermediate layers include a phenolic resin, or a polymer having a structural unit represented by a general formula (I):

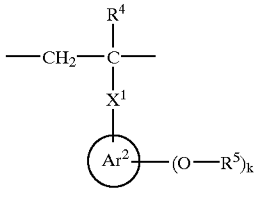

wherein $Ar^2$ represents a benzene ring, a naphthalene ring, or an anthracene ring; $R^4$ represents a hydrogen atom or a methyl group; $R^5$ represents a hydrogen atom or an alkoxy group having 20 or less carbon atoms; $X^1$ represents either a single bond or a bivalent linking group which contains at least one atom selected from C, H, N, O, and S and has 0 to 20 carbon atoms; and k is an integer of 1 to 4.

12. The image forming material of claim 1 wherein the infrared absorbent is a dye or pigment having an absorption maximum at a wavelength between 760 nm and 1200 nm.

13. The image forming material of claim 1, further comprising an undercoat layer provided between the intermediate layer and the support.

14. The image forming material of claim 1, wherein the support comprises at least one material selected from the group consisting of a polyester film and an aluminum plate.

15. The image forming material of claim 1, wherein at least one of the recording and intermediate layers includes at least one material selected from the group consisting of a nonionic surfactant, an amphoteric surfactant, and a plasticizer.

16. The image forming material of claim 1, wherein the recording layer is a cross-linkable layer that is curable by an acid, which is generated by light or heat and functions as a catalyst, and the intermediate layer is a radical polymerizable layer which is curable by radicals, which are generated by light or heat and function as an initiator.

17. The image forming material of claim 1, wherein the intermediate layer differs from the recording layer by including at least one of an increased concentration of a photosensitive or heat-sensitive compound, a binder having increased developability due to difference from at least one of ahydrophilic group, ahydrophobic group, molecular weight, a sensitization aid, and any combination thereof, thereby providing said greater sensitivity than that of the recording layer.

18. The image forming material of claim 1, wherein the intermediate layer includes a polymer having a weight-average molecular weight of at least 5000, a number-average molecular weight of at least 1000, and a polydispersion degree of at least 1, wherein the polydispersion degree is defined as the weight-average molecular weight divided by the number-average molecular weight.

19. A method of making an image forming material, comprising the steps of:

(a) providing a support;

(b) disposing on the support an intermediate layer that includes a first composition having a solubility in water or an alkali aqueous solution that changes when subjected to light or heat so that the intermediate layer has a solubility in water or the alkali aqueous solution that is changed when subjected to light or heat; and (c) disposing on the intermediate layer a recording layer that includes a second composition having a solubility in the same one of water or an alkali aqueous solution as the composition included it the intermediate layer, which solubility of the composition included in the recording layer changes when subjected to light or heat, said image forming material further comprising an infrared absorbent to permit formation of an image using an infrared laser, wherein the change in solubility of the intermediate layer in water or in an alkali aqueous solution when the intermediate layer is subjected to light or heat is greater than that of the recording layer when the recording layer is subjected to light or heat.

* * * * *